(12) United States Patent
Iwao

(10) Patent No.: US 6,321,169 B1
(45) Date of Patent: Nov. 20, 2001

(54) EQUIVALENT CIRCUIT OF INDUCTANCE ELEMENT, METHOD OF ANALYZING CIRCUIT CONSTANTS, SIMULATOR, AND RECORD MEDIA

(75) Inventor: Hidemi Iwao, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/256,787

(22) Filed: Feb. 24, 1999

(30) Foreign Application Priority Data

Feb. 27, 1998 (JP) .................................................. 10-064093

(51) Int. Cl.$^7$ ..................................................... G01R 25/00
(52) U.S. Cl. ................................. 702/65; 702/75; 702/76; 702/117
(58) Field of Search .................................. 702/65, 75, 76, 702/117

(56) References Cited

U.S. PATENT DOCUMENTS 4,731,585 * 3/1988 Fox ....................................... 324/322
4,808,868 * 2/1989 Roberts .................................. 310/68
6,137,293 * 10/2000 Wu et al. .............................. 324/638

\* cited by examiner

*Primary Examiner*—Arthur T. Grimley
*Assistant Examiner*—John Le
(74) *Attorney, Agent, or Firm*—McDermott, Will & Emery

(57) ABSTRACT

An equivalent circuit and an analysis method are provided for highly accurately indicating characteristic of an inductance element wherein ferrite material is used.

An equivalent circuit is used, wherein a closed circuit with resistance Rm1 and Rm2, and inductance Lm1 and Lm2 magnetically connects to inductance Ls of LsCpRp parallel circuit at coupling coefficients k1 and k2. First, the values of circuit constants Ls, Rp, and Cp are determined by making use of the conditions at the resonance point. Next, changes of reactance component in the equivalent circuit for frequency are calculated, based on the determined values of circuit constants Ls, Rp, and Cp, and find the values of frequency fm1 and fm2 whereat reactance component should be decreased by comparing frequency changes of measured reactance component. Then, the values of circuit constants Rm1, Rm2, Lm1, and Lm2, and the values of coupling coefficients k1 and k2 are determined, based on the measured values to obtain characteristic in consideration of inductance decrease caused by phenomenon of magnetic resonance.

13 Claims, 25 Drawing Sheets

FIG. 5

S40: Redetermine Rp: Find the values of RL, XL, and Bc by substituting the frequency fo at the resonance point, the resistance component Ro and the values of circuit constants Ls, Cp, Lm1, Rm1, k1, Lm2, Rm2, k2 in the expressions $$RL = \frac{(2\pi fo \cdot k1)^2 Rm1 \cdot Ls/Lm1}{(2\pi fo)^2 + (Rm1/Lm1)^2} + \frac{(2\pi fo \cdot k2)^2 Rm2 \cdot Ls/Lm2}{(2\pi fo)^2 + (Rm2/Lm2)^2}$$

$$XL = 2\pi fo \cdot Ls\left(1 - \frac{(2\pi fo \cdot k1)^2}{(2\pi fo)^2 + (Rm1/Lm1)^2} - \frac{(2\pi fo \cdot k2)^2}{(2\pi fo)^2 + (Rm2/Lm2)^2}\right)$$

$$Bc = 2\pi f0 Cp$$

And redetermine the value of Rp by solving the equation $$Rp = Ro/(1 - Bc \cdot Ro \cdot RL/XL)$$

S42: Determine Lr and Cr: Compare the frequency wherein the resistance component and the reactance component cross, with the frequency wherein the reactance component shows its maximum?

S44: If these two frequencies are the same, or the former is lower than the latter, then Lr→∞ and Cr→∞.

S46: If the former is higher than the latter, find the value of Lr by substituting the values of frL (frequency wherein the resistance component should be restrained) and Rp in the expression Lr=Rp/(2π frL). Then, find the value of Cr by substituting the values of frC (frequency wherein the reactance component should be restrained) and Rp in the expression Cr=1/(2π frCRp).

S48: Determine Rs: The measured value of direct current is represented by Rs.

End

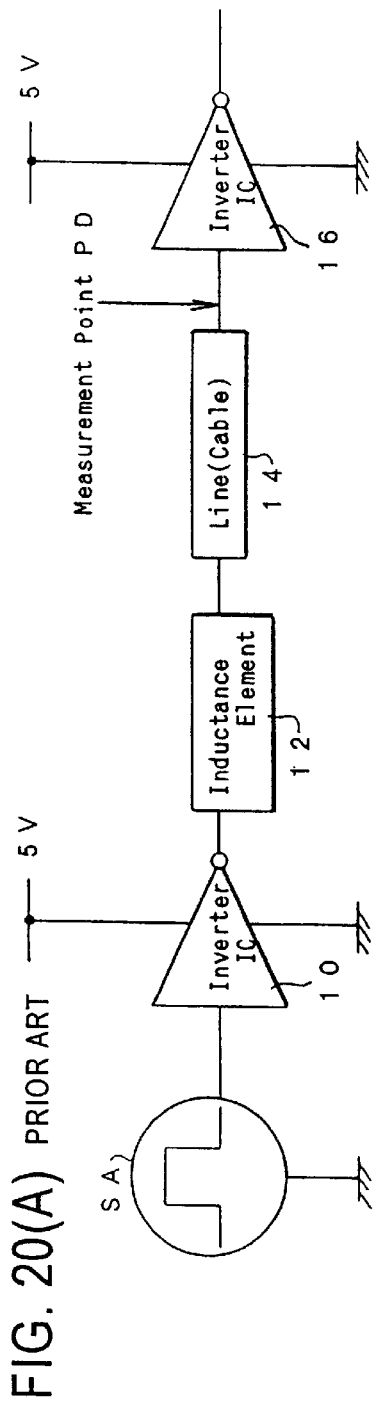
FIG. 20(A) PRIOR ART
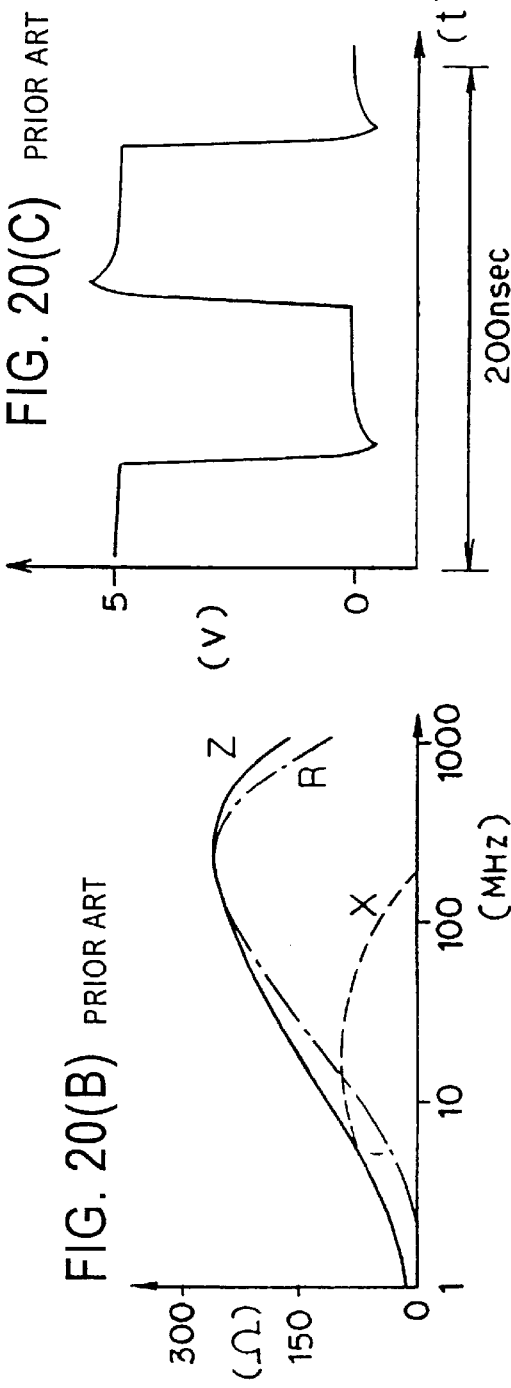
FIG. 20(C) PRIOR ART
FIG. 20(B) PRIOR ART

EQUIVALENT CIRCUIT OF INDUCTANCE ELEMENT, METHOD OF ANALYZING CIRCUIT CONSTANTS, SIMULATOR, AND RECORD MEDIA

FIELD OF THE INVENTION

The present invention relates to technology of analyzing circuit constants of inductance element. More specifically, the present invention relates to equivalent circuits of inductance element that are also suitable in the case that ferrite material is used, methods of analyzing circuit constants of the same, and simulator and record media of the same.

BACKGROUND OF THE INVENTION

There are many electronic appliances wherein an inductance element is installed, ferrite material is used for the electric signal line and the power line thereof, to prevent electromagnetic interference. FIG. 20(A) shows a model circuit of such electronic appliances. In FIG. 20(A), an inductance element 12 connects to the output end of inverter IC 10 whereto a voltage of 5 volts is placed, and line(cable) 14 connects to the output end of inductance element 12. Inverter IC 16 connects to the output end of line 14. FIG. 20(B) shows a frequency characteristic of the inductance element 12. In FIG. 20(B), Z, R, and X represent impedance, resistance part, and reactance part, respectively. As FIG. 20(B) shows, reactance component X decreases and resistance component R increases as the frequency becomes higher. When a pulse signal is input into such an electric signal line stated above, signals with wave forms as shown in FIG. 20(C) are read at the measurement point PD.

It is a common practice to depend on measured values in selecting an inductance element, and confirming what are the effects caused by the inserted element, and the like. However, if it is made possible to obtain results equivalent to measured values by simulations, measurement will no longer be necessary, and the time for reviewing may be shortened. Thus, to support this assumption, creating an equivalent circuit that demonstrates characteristics of the inductance element well is under study.

Generally, LsCpRp parallel equivalent circuit as shown in FIG. 21(A) is well known as the equivalent circuit stated above. This is a circuit wherein inductance Ls, capacitance Cp, and resistance Rp are in parallel connection. If circuit constants of an inductance element that has the same frequency characteristic as shown in FIG. 20(B) are determined by using such an equivalent circuit, the process is as follows.

First, impedance Z that represents the impedance of the whole equivalent circuit shown in FIG. 21(A) is given by the equation, Z=R+jX. In this equation, "R", "X", and "j" represents resistance component (real number), reactance component, and imaginary unit, respectively. Then, resistance component R and reactance component X are given by Expressions 1 and 2, respectively, as follows:

$$R = \frac{(2\pi f \cdot Ls)^2 / Rp}{(1 - (2\pi f)^2 Ls \cdot Cp)^2 + (2\pi f \cdot Ls)^2 / Rp^2}$$ Expression 1

$$X = \frac{2\pi f \cdot Ls(1 - (2\pi f)^2 Ls \cdot Cp)}{(1 - (2\pi f)^2 Ls \cdot Cp)^2 + (2\pi f \cdot Ls)^2 / Rp^2}$$ Expression 2

In these expressions, "f" represents frequency. In the frequency domain wherein resistance component R is small and the expression Z≈jX holds, Expression 3 holds. When the frequency is 1 MHz, reactance component X measures 85 Ω. Substituting this value of X in Expression 3 yields Ls=13.5 µH.

$$X = 2\pi f \cdot Ls$$ Expression 3

Secondly, at the resonance point, Expression 4 holds.

Expression 4

$$1 = (2\pi f)^2 Ls Cp, \ R = Rp$$

With this Expression, Rp (measured value of resistance component R at the resonance point)=640 Ω is selected. Regarding Cp, substituting the values R=200 Ω (measured value of resistance component R at 1 GHz), Ls=13.5 µH, and Rp=640 Ω Expression 1 yields Cp=0.37 pF. Applying the selected values of circuit constants Ls=13.5 µH, Rp=640 Ω, and Cp=0.37 pF to the equivalent circuit of FIG. 21(A) gives the impedance characteristic as shown in FIG. 21(B).

Comparing FIG. 21(B) that shows a simulation result by making use of an equivalent circuit with FIG. 20(B) that shows measured values clearly indicates that there is a big difference between the two graphs, and that the equivalent circuit in FIG. 21(A) does not make an accurate analysis of the measured values. Especially, values of reactance component X at around 7.5 MHz are too large in FIG. 21(B). This indicates that structuring a simulator with the equivalent circuit in FIG. 21(A) does not bring about sufficiently accurate results.

Next, we are going to select circuit constants of an inductance element that has the same impedance frequency characteristic as shown in FIG. 22(A), by using the equivalent circuit of FIG. 21(A). Just as in the case of comparing FIG. 21(B) with FIG. 20(B), the value Ls=0.96 µH is selected because a measured value of reactance component X at 10 MHz is 60 Ω. At the resonance point, the expressions 1=(2πf)²LsCp and R=Rp hold. Therefore Rp (a measured value of resistance component R at the resonance point)=1170 Ω is selected. The value Cp=0.094 pF is found by substituting the values R=530 Ω (an actual value of "R" at 1.8 GHz), Ls=0.96 µH, and Rp=1170 Ω in the said Expression 1.

Applying the selected values of circuit constants Ls=0.96 µH, Rp=1170 Ω, Cp=0.094 pF to the equivalent circuit of the FIG. 21(A) yields the impedance characteristic as shown in FIG. 22(B). There is a significant difference between FIG. 22(A) and FIG. 22(B). This indicates that the equivalent circuit of FIG. 21(A) does not make an accurate analysis of measured values. Especially, a value of reactance component X at around 200 MHz is too large in FIG. 22(B). In addition, in FIG. 22(B), the value of reactance component X is the largest at around 100 MHz, and values of resistance component R are smaller up to around 40 MHz. These are also differences from FIG. 22(A). This also indicates that the equivalent circuit in FIG. 21(A) does not make an accurate analysis of measured values.

These inconveniences is attributed to the fact that the frequency characteristic of the ferrite material used in inductance element 12 can not be demonstrated by the equivalent circuit of FIG. 21(A). It is well known that each ferrite material has its specific resonance frequency, and brings about phenomenon of magnetic resonance in the frequency domain above the level of the said specific resonance frequency. Therefore, permeability temporally decreases (when considering it as an inductance element, value decrease of reactance component X occurs), or increases at the specific oscillation frequency.

SUMMARY OF THE INVENTION

The present invention focuses attention on the above mentioned points, and has purposes of providing an equivalent circuit with high accuracy that well demonstrates characteristics of an inductance element, circuit constants, analysis methods of the same, and simulator of the same. Another purpose is to provide equivalent circuit of inductance element suitable for inductance element wherein ferrite material is used, analysis methods of the same, a simulator and record medium of the same.

An equivalent circuit of inductance element of the present invention comprises a parallel circuit whereto an inductance, a capacitance, and a resistance are connected in parallel. And the present invention features that said inductance is magnetically coupled to closed circuits comprising a resistance and other inductance. A circuit constant analysis method of inductance element of the present invention features obtainment of the desired impedance frequency characteristic of an inductance element by adjusting the circuit constants of said closed circuit.

The above and other objects, features and advantages of the present invention will become apparent from the following detailed description taken with the accompanying drawings.

BRIEF DESCRIPTION OF THE DRAWINGS

FIG. 1 shows Embodiment 1 of the present invention.

FIG. 2 through FIG. 5 show a flowchart explaining analysis process in said Embodiment 1.

FIG. 6(A) is a diagram showing the part of closed circuit of the equivalent circuit of FIG. 1(A).

FIG. 11(A) shows an equivalent circuit of Embodiment 5.

FIG. 13(A) is a circuit diagram, FIG. 13(B) is a graph of an example characteristic of the circuit.

FIG. 15(A) is a diagram of an equivalent circuit of Embodiment 6.

FIG. 17(A) is a diagram of an equivalent circuit of Embodiment 7.

FIG. 20(A) and FIG. 20(B) relates to a signal line wherein an inductance element is used. FIG. 20(A) is a block diagram showing the structure, and FIG. 20(B) is a graph showing an example of the impedance frequency characteristic. FIG. 20(C) is an example of waveforms which are read after the output of the inductance element.

FIG. 21(A) is a diagram of the equivalent circuit, and FIG. 21(B) is a graph showing an example of the impedance frequency characteristic. FIG. 20(C) is a voltage diagram corresponding to FIG. 10

DETAILED DESCRIPTION

The present invention is susceptible of numerous physical embodiments, depending upon the environment and requirements of use, substantial numbers of the herein shown and described embodiments have been made, tested and used, and all have performed in an eminently satisfactory manner.

Embodiment 1

Figure 1A:
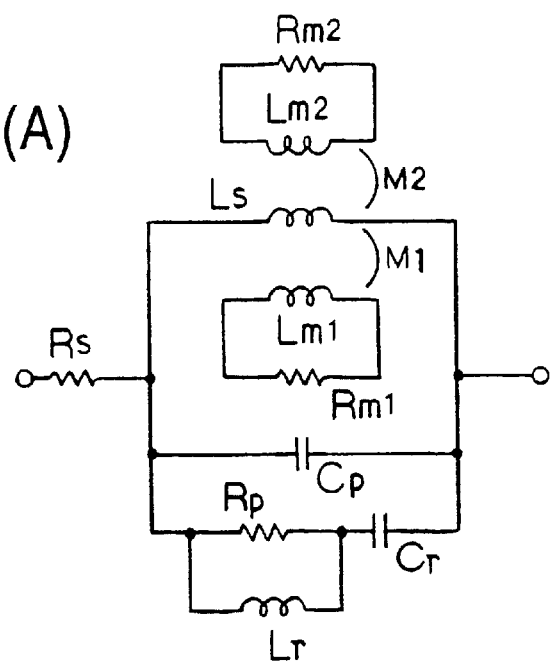
FIG. 1(A) shows an equivalent circuit.

In Embodiment 1, a magnetic coupling circuit as shown in FIG. 1(A) is used as an equivalent circuit of inductance element wherein ferrite material is used. In FIG. 1(A), a closed circuit wherein resistance Rm1 and inductance Lm1 connect are connected is magnetically connected to inductance Ls in said parallel circuit LsCpRp at coupling coefficient k1, and mutual inductance M1 is formed between inductance Ls and Lm1. The expression, $M1=k1\sqrt{(LsLm1)}$, holds. In addition, a closed circuit wherein resistance Rm2 and inductance Lm2 are connected is magnetically connected to inductance Ls at coupling coefficient k2, and mutual inductance M2 is formed between inductance Ls and Lm2. The expression, $M2=k2\sqrt{(LsLm2)}$, holds Inductance Lr and capacitance Cr are connected in parallel and in series, respectively, to resistance Rp. In addition, resistance Rs is connected to one end of said circuit.

In this embodiment, circuit constants for the equivalent circuit of FIG. 1(A) is selected through the process shown in FIG. 2 through FIG. 5. In the following paragraph, selection process of circuit constants for the inductance element that has a frequency characteristic shown in FIG. 20(B) will be explained.

(1) Determining the value of Ls (Step S10) . . . First, measure a value of impedance XL at frequency fL whereat the expression $Z \approx jX$ holds below the resonance point. Then substitute the measured value XL in the expression Ls=XL/(2πfL), a variant of said Expression 3. In this example, as FIG. 20(B) shows, the expression Z≈jX holds at 1 MHz. So, the value Ls=13.5 µH is found by substituting XL=85 Ω and fL=1 MHz in the expression.

(2) Determining the value of Rp (Step 12) . . . Measure an actual value Ro at the resonance point wherein the expression Z=jX holds, then substitute the value of Ro in Expression 4. FIG. 20(B) shows that the measured value Ro reads 640 Ω at the resonance point. From the above, the value Rp=640 Ω is found.

(3) Determining the value of Cp (Step S14 through Step S18) . . . Find the frequency fc in the frequency domain above the resonance point whereat the expression Z≈jX holds, and measure the value Xc. If the values are given by the measurement, substitute them in the expression Cp=1/(2πfcXc). If the values are not given, measure the value of Rh at the frequency fh in the frequency domain above the resonance point, then perform mathematical operations to find the value of Cp, by substituting the values of said Ls and Rp in Expression 5.

$$Cp = \frac{\sqrt{(1/Rh - 1/Rp)}}{2\pi fh\sqrt{Rp}} + \frac{1}{(2\pi fh)^2 Ls} \quad \text{Expression 5}$$

In this example, substituting the values Rh=200 Ω, Ls=13.5 µH and R p=640 Ω, all of which are measured values when the frequency fh is 1 GHz, yields Cp=0.37 pF.

(4) Determining the value of reactance component X (Step S20) . . . The expression that expresses the change of the value of reactance component X at each frequency f is given by substituting the values of Ls, Rp, and Cp in said Expression 2.

(5) Determining the values of Rm1 and Lm1 (Steps S22 through S26) . . . With regard to the reactance component X, compare the graph given by Expression 2 and the graph showing the measured values. If these graphs are significantly different and it is preferable to decrease the value of reactance component X, determine the value of frequency fm1 that should be decreased the most, and the values of Rm1 and Lm1 so that these values satisfy the expression Rm1/Lm1= 2πfm1. Then go to the next step stated in paragraph (6).

However, if these graphs do not significantly differ and it is not necessary to decrease the value of reactance component X, any values may be selected for Rm1, Lm1, Rm2, and Lm2, provided that Lm1≠0, Lm2≠0, k1=0, and k2=0. When the values of k1 and k2 are both zero, both of a circuit magnetically coupled with a closed circuit comprising Rm1 and Lm1 and a closed circuit comprising Rm2 and Lm2, at coupling coefficient k1, and k2, respectively, are eliminated. In this case, go to the step stated in paragraph (11).

In the example shown in FIG. 20(B), there is a big difference between the calculated values and the measured values, so that fm1=7.5 MHz (the frequency value that should be decreased the most) is found. Therefore, the values Lm1=13.5 µH and Rm1=635 Ω are determined so that these values satisfy the expressionR m1/Lm1=2πfm1.

(6) Determining the value of k1 (Step S28) . . . The value of reactance component X1 is calculated by substituting the values of fm1, Ls, Cp, and Rp in Expression 6, then the target value of Xm1, that should be decreased from the measured value is found. And the value of coupling coefficient k1 is found by substituting the values of X1 and Xm1 in the expression k1= √(2(1−Xm1/X1)).

$$X = \frac{2\pi fm1 \cdot Ls(1 - (2\pi fm1)^2 Ls \cdot Cp}{(1 - (2\pi fm1)^2 Ls \cdot Cp)^2 + (2\pi fm1 \cdot Ls)^2 / Rp^2} \quad \text{Expression 6}$$

In the example shown in FIG. 20(B), the value X1=310 Ω(the value of reactance component in LsCpRp parallel circuit) and the value Xm1=240 Ω(that should be decreased), were found when said frequency fm1 was 7.5 MHz. Using these values, the value k1=0.67 is found.

(7) Calculating the value of reactance component in the parallel circuit LsRpCp whereto a closed circuit is magnetically coupled. (Step S30) . . . The values of RL, XL, and Bc are found by substituting the values of circuit constants Ls, Cp, Lm1, Rm1, and k1 in the following Expressions 7 through 9. Then, the values of reactance component X for each frequency is found by substituting the values of RL, XL, Rp, and Bc in Expression 10.

$$RL = \frac{(2\pi f \cdot k1)^2 Rm1 \cdot Ls/Lm1}{(2\pi f)^2 + (Rm1/Lm1)^2} \quad \text{Expression 7}$$

$$XL = 2\pi f \cdot Ls\left(1 - \frac{(2\pi f \cdot k1)^2}{(2\pi f)^2 + (Rm1/Lm1)^2}\right) \quad \text{Expression 8}$$

$$Bc = 2\pi f\, Cp \quad \text{Expression 9}$$

$$X = \frac{XL(1 + RL/Rp - Bc \cdot XL/Rp) - RL \cdot Bc(RL + XL)/Rp}{(1 + RL/Rp - Bc \cdot XL/Rp)^2 - (Bc(RL + XL)/Rp)^2} \quad \text{Expression 10}$$

(8) Determining the values of Rm2 and Lm2 (Steps S32 through S36) . . . The next thing to do is to compare the measured values with the values of reactance component X obtained through the above mentioned process. If the difference between the two is large and the values of reactance component X should be decreased, determine the value of frequency fm2 that should be decreases the most, then determine the values of Rm2 and Lm2 so that they satisfy Expression 11. Afterwards, go to the next step stated in paragraph (9).

$$Rm2/Lm2=2\pi f\, m2 \quad \text{Expression 11}$$

However, if the difference between the two values is small and it is unnecessary to decrease the value of reactance component X, any values may be selected for Rm2 and Lm2, provided that Lm2≠0 and k2=0. Then go to the next step stated in paragraph (10). In this step, conditioning k2=0 automatically eliminates, from the equivalent circuit in FIG. 1(A), the circuit that is magnetically coupled to the series closed circuit comprising Rm2 and Lm2 at coupling coefficient k2.

The example in FIG. 20(B) shows a large difference between the calculated values of reactance component X and its measured value, and the frequency fm2 that should be decreased the most is 30 MHz. Therefore, using Expression 11, the values Lm2=13.5 µH and Rm2=2600 Ω are found.

(9) Determining the value of k2 (Step S38) . . . Next, the values of RL, XL, and Bc are found by substituting the values of said frequency fm2, Ls, Cp, Lm1, Rm1, k1 in Expressions 12 and 13, and 9. Then, the value of reactance X2 is calculated by substituting the values of RL, XL, Rp, and Bc in Expression 14. Afterwards, the target value Xm2 that should be decreased is calculated, then the value of coupling coefficient k2 is found by substituting the target value Xm2 in Expression 15.

$$RL = \frac{(2\pi fm2 \cdot k1)^2 Rm1 \cdot Ls/Lm1}{(2\pi fm2)^2 + (Rm1/Lm1)^2} \quad \text{Expression 12}$$

$$XL = 2\pi fm2 \cdot Ls\left(1 - \frac{(2\pi fm2 \cdot k1)^2}{(2\pi fm2)^2 + (Rm1/Lm1)^2}\right) \quad \text{Expression 13}$$

$$X = \frac{XL(1 + RL/Rp - Bc \cdot XL/Rp) - RL \cdot Bc(RL + XL)/Rp}{(1 + RL/Rp - Bc \cdot XL/Rp)^2 - (Bc(RL + XL)/Rp)^2} \quad \text{Expression 14}$$

$$k2 = \sqrt{(2(1-k1^2)(1-Xm2/X2))} \quad \text{Expression 15}$$

In the example of FIG. 20(B), the value of coupling coefficient k2=0.32 is given by substituting the values X=185 Ω(a reactance value in LsCpRp parallel circuit at said frequency fm2), Xm2=170 Ω, and k1=0.67 in Expression 12.

(10) Redetermining the value of Rp (Step S40) . . . The values of RL, XL, and Bc are calculated by substituting the value of fo (the frequency at the resonance point), Ro (the resistance component of impedance), and the values of circuit constants Ls, Cp, Lm1, Rm1, k1, Lm2, Rm2, and k2 in Expressions 16, 17, and 7, then the value of Rp is redetermined by solving Expression 18.

$$RL = \frac{(2\pi fo \cdot k1)^2 Rm1 \cdot Ls/Lm1}{(2\pi fo)^2 + (Rm1/Lm1)^2} + \frac{(2\pi fo \cdot k2)^2 Rm2 \cdot Ls/Lm2}{(2\pi fo)^2 + (Rm2/Lm2)^2} \quad \text{Expression 16}$$

$$XL = 2\pi fo \cdot Ls\left(1 - \frac{(2\pi fo \cdot k1)^2}{(2\pi fo)^2 + (Rm1/Lm1)^2} - \frac{(2\pi fo \cdot k2)^2}{(2\pi fo)^2 + (Rm2/Lm2)^2}\right) \quad \text{Expression 17}$$

$$Rp = Ro/(1 - Bc \cdot Ro \cdot RL/XL) \quad \text{Expression 18}$$

In the example of FIG. 20(B), the values are found as follows: RL=504 Ω, XL=4830 Ω, and Bc=0.283 mS. In addition, the value of Rp=640 Ω is found by substituting the value of Ro=640 Ω, (the value of resistance component at the resonance point) in Expression 18.

(11) Determining the values of Lr and Or (Step S42 through S46) . . . Next, in FIG. 20(B), compare the frequency whereat the curves representing resistance component R and reactance component X cross, and the frequency whereat the reactance component X shows its maximum. If these two frequencies are the same or if the former frequency is lower than the latter, determine Lr→∞ and Cr→∞, then go to the next step in paragraph (12). In this case, inductance Lr and capacitance Cr are eliminated from the equivalent circuit of FIG. 1(A).

On the other hand, if the former frequency is higher than the latter, the value of Lr is found by substituting the values of frL(frequency to restrain resistance component R of impedance Z), and Rp in the Expression Lr=Rp/(2πfrL). Then, the value of Cr is found by substituting the values of frc(frequency to keep reactance component X of impedance Z large, and Rp in the Expression Cr=1/(2πfrcRp).

In the example of FIG. 20(B), the frequency whereat the curves representing resistance component R and reactance component X cross is about 6 MHz, and the frequency whereat the reactance component X shows its maximum is about 8 MHz. Therefore, the expressions, Lr→∞ and Cr→∞, are given.

(12) Determining the value of Rs (Step S48) . . . In this step, measure the value of direct current resistance, and the value is represented by Rs. In the example of FIG. 20(B), the measured value of direct current resistance is 0.28 Ω, so the value Rs=0.28 Ω is given.

Figure 1B:
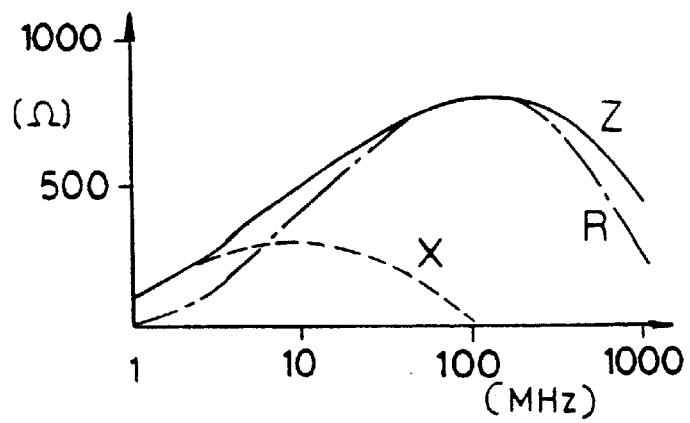
FIG. 1(B) shows an example of a characteristic of an equivalent circuit.

Applying the circuit constants obtained through the above stated process to the equivalent circuit of FIG. 1 results in the frequency characteristic as shown in FIG. 1(B). Comparing FIG. 1(B) with FIG. 20(B) indicates that these two graphs show quite similar frequency characteristic, and that the equivalent circuit in FIG. 1(A) is significantly accurate.

Figure 1C:
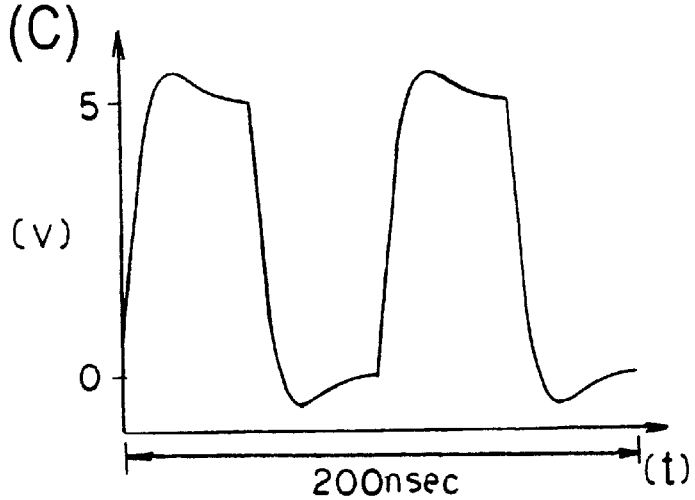
FIG. 1(C) is a an example diagram of voltage waveform when using the equivalent circuit.
Figure 2:
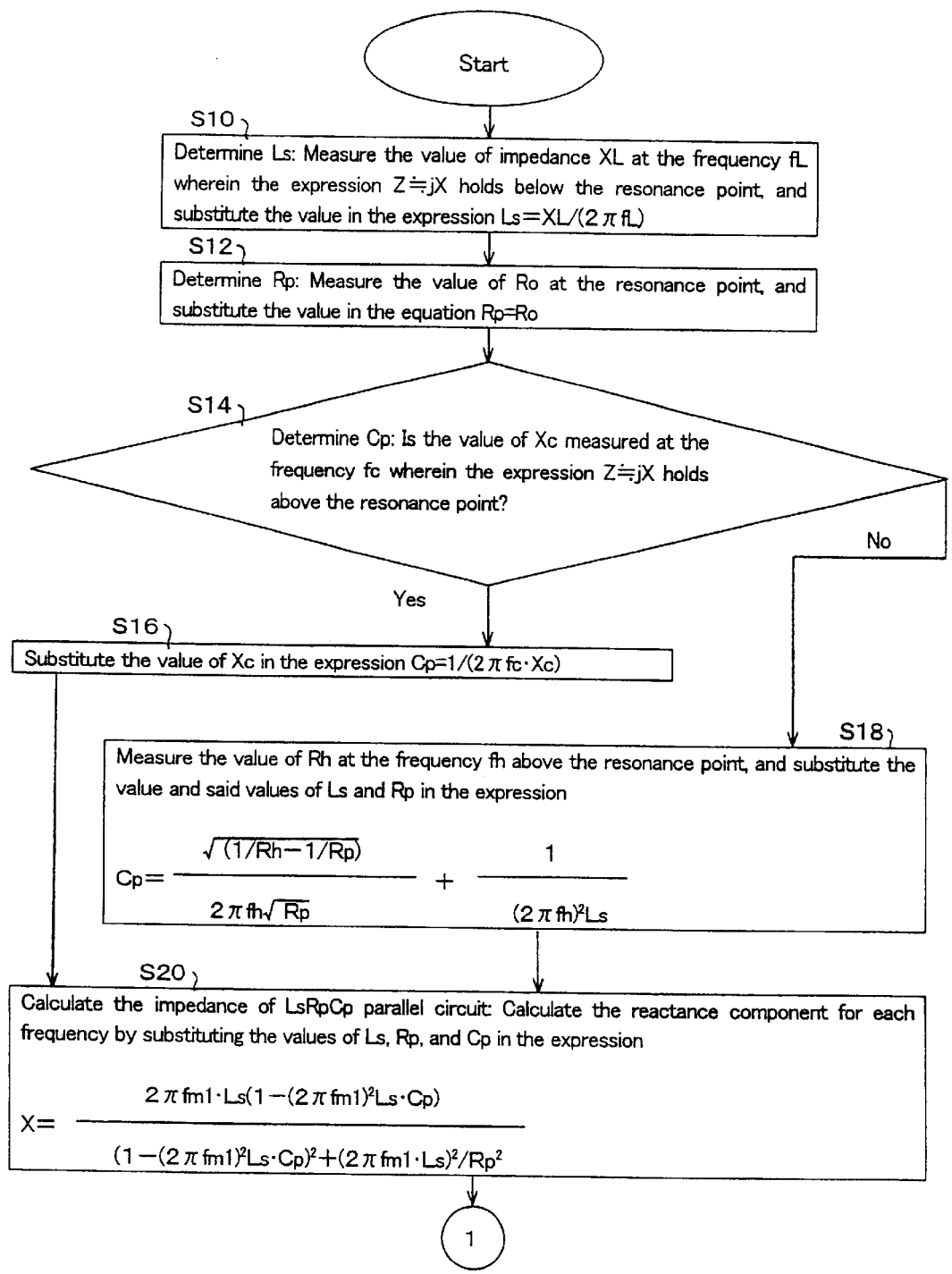
Figure 3:
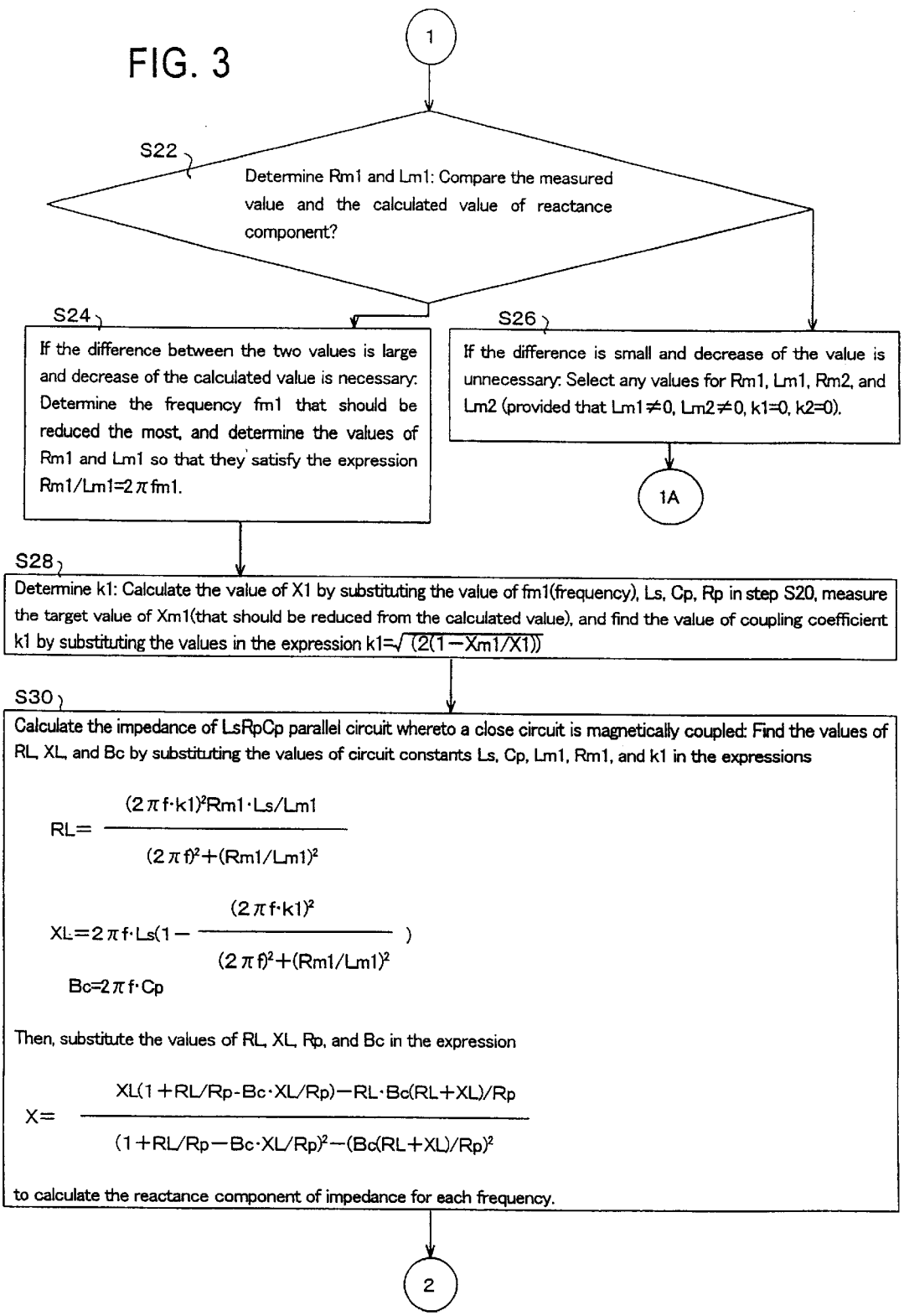
Figure 4:
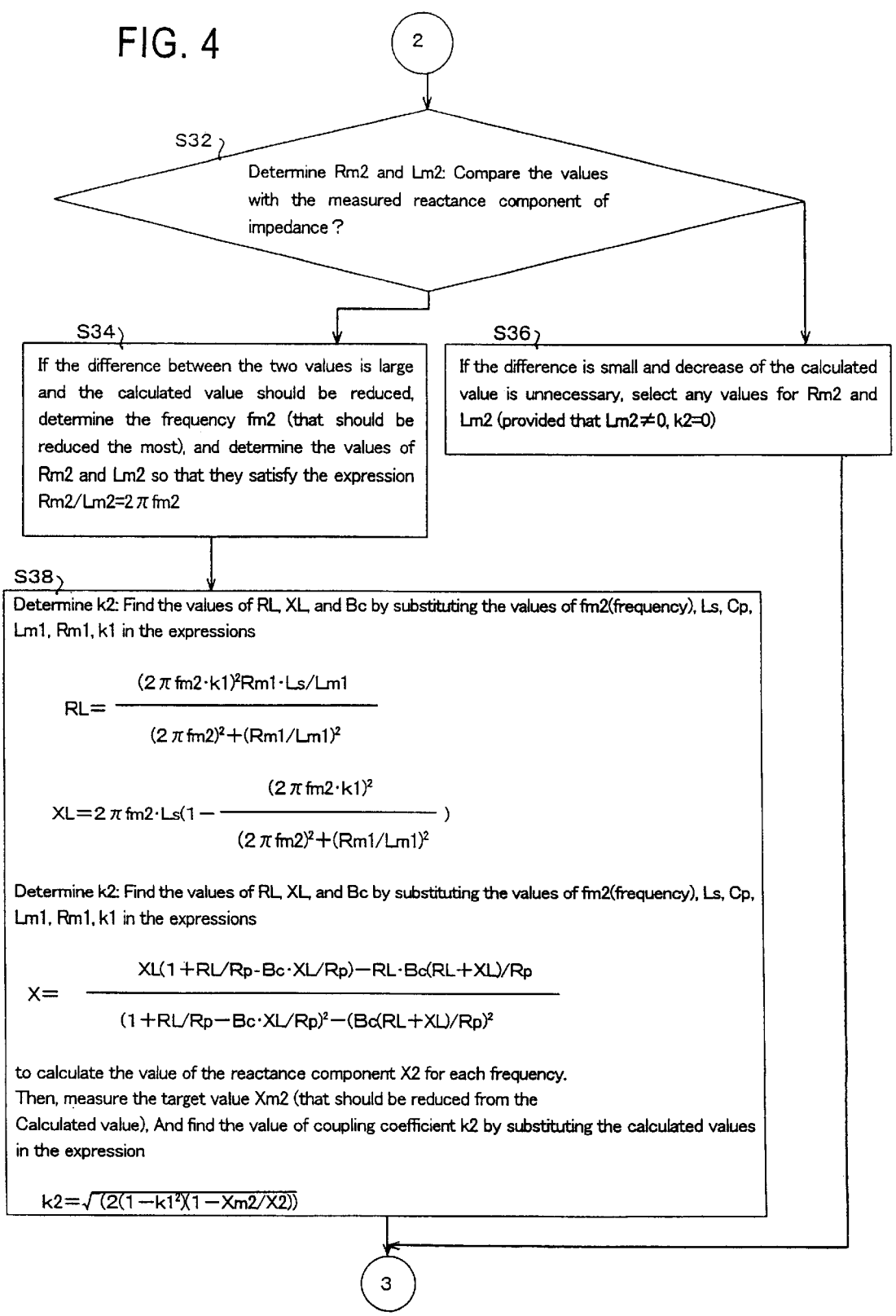

Simulating the waveform of the circuit of FIG. 20(A) by mounting the equivalent circuit that has the circuit constants obtained through the above stated analysis process on inductance element 12 of FIG. 20(A) results in FIG. 1(C). Comparing FIG. 1(C) with FIG. 20(C) clearly indicates that the equivalent circuit in FIG. 1(A) will be a component of a simulator with high accuracy.

Figure 6A:
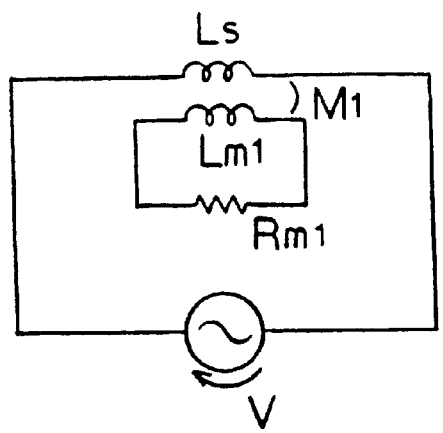
FIGS. 6(A) and (B) relate to the part of closed circuit taken out of the equivalent circuit of FIG. 1.

Next, selection method of circuit constants for a closed circuit will be explained. FIG. 6(A) shows a circuit wherein a closed circuit with resistance Rm1 and inductance Lm1 in series is connected to inductance Ls at coupling coefficient k1. Inductance of the circuit of FIG. 6(A) is given by Expression 19.

$$Ls\left(1 - \frac{(2\pi f)^2 k1^2}{(2\pi f)^2 + (Rm1/Lm1)^2}\right) \quad \text{Expression 19}$$

Figure 6B:
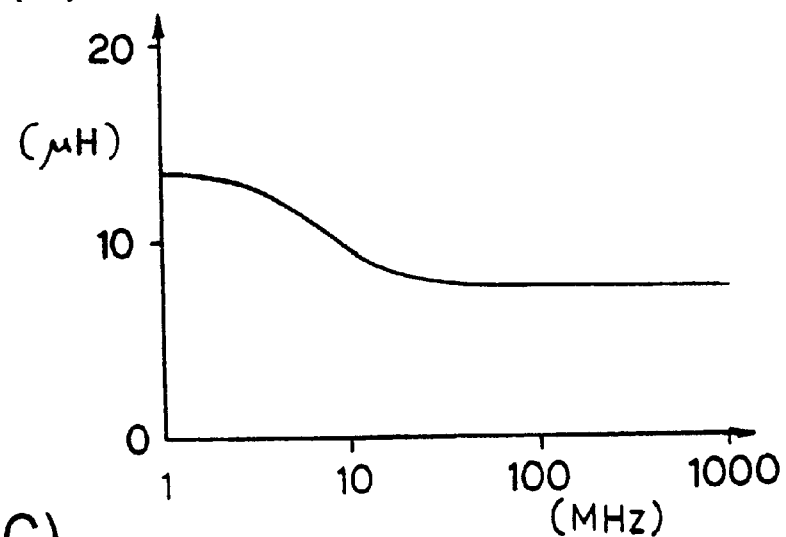
FIG. 6(B) is a graph showing changes of inductance frequency in the case that the equivalent circuit of FIG. 1(A) has one closed circuit.

As stated above, the frequency characteristic of the inductance in the circuit in the case that Ls=13.5 μH, k1=0.67, Rm1=635 Ω, and Lm1=13.5 μH is shown in FIG. 6(B). In this FIG. 6(B), the frequency whereat the graph shows the steepest inclination is found by differentiating Expression 19 once, with expressing frequency by logarithm function, and is given by Expression 20 as follows.

$$-\frac{2(k1^2(2\pi f))^2 (Rm1/Lm1)^2 Ls}{((2\pi f)^2 + (Rm1/Lm1)^2)^2} \quad \text{Expression 20}$$

Differentiating Expression 20 once more, and finding the condition wherein variations equal "zero" will give an equivalent expression to Expression 11, 2π f=Rm1/Lm1. The expression relating to Rm1 and Lm1 is given through such process.

Inductance at this frequency is given as the expression $Ls(1-k1^2/2)$ by substituting the expression, $2\pi f = Rm1/Lm1$, in said Expression 19. Multiplying the expression $Ls(1-k1^2/2)$ by this frequency yields the expression $Xm1=X1(1-k1^2/2)$ that is an expression relating to reactance component X of impedance Z and coupling coefficient k1.

Permeability of ferrite material begins falling off at a certain frequency, and keeps falling off until it reaches "zero," not stopping at a certain lower limit. However, reactance component X of impedance Z in the equivalent circuit whereto a closed circuit is magnetically coupled gradually converges at the lowest limit $Ls(1-k1^2)$ as shown in FIG. 6(B). In the case of an inductance element wherein ferrite material is used for the magnetic core, there is a concern that, in the frequency domain wherein the reactance component X converges to said lowest limit, the characteristics demonstrated by the equivalent circuit might have a large difference from the calculation.

Accordingly, this embodiment prepares the second closed circuit and determines circuit constants so that reactance component X decreases in the frequency domain wherein the differences are large. Reactance component X of impedance Z of the equivalent circuit whereto the second closed circuit with resistance Rm2 and inductance Lm2 in series is magnetically coupled at coupling coefficient k2, is given by Expression 21.

$$Ls\left(1 - \frac{(2\pi f)^2 k1^2}{(2\pi f)^2 + (Rm1/Lm1)^2} - \frac{(2\pi f)^2 k2^2}{(2\pi f)^2 + (Rm2/Lm2)^2}\right) \quad \text{Expression 21}$$

From Expression 21, the frequency whereat the closed circuit causes the steepest decline is given as the expression $2\pi f=Rm2/Lm2$. When determining the frequency as in the frequency domain wherein the reactance component converges to said lowest limit in the case of the equivalent circuit with one closed circuit, the reactance component X of the equivalent circuit at the frequency is given by the expression $Ls(1-k1^2-k2^2/2)$. The expression regarding reactance component X of impedance Z and coupling coefficient k1 in the equivalent circuit in FIG. 1(A), X $m2=X2(1-k2^2/(1-k1^2)/2)$, is given by multiplying the above expression by the frequency.

Figure 6C:
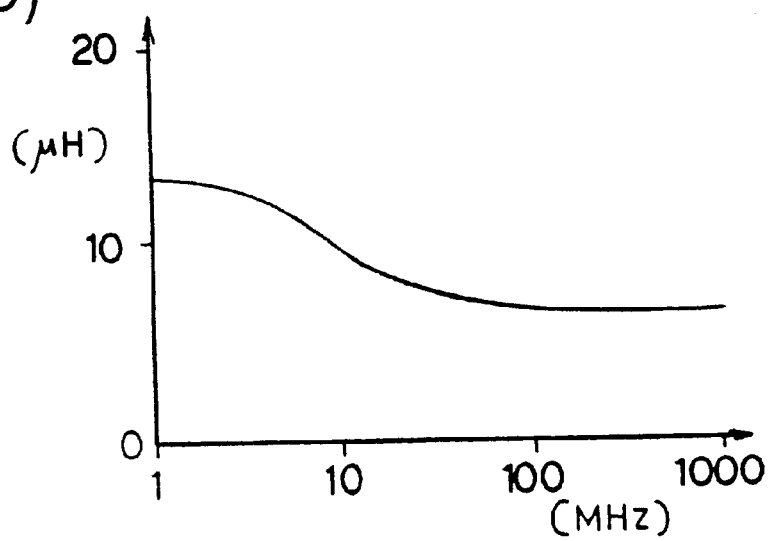
FIG. 6(C) is a graph showing changes of inductance frequency in the case of Embodiment 1.

FIG. 6(C) shows the frequency characteristic of reactance component X in the equivalent circuit in FIG. 1(A) when the following values of the circuit constants are given: Ls=13.5 $\mu$H, k1=0.67, Rm1=635 $\Omega$, Lm1=13.5 $\mu$H, k2=0.30, Rm2=2600 $\Omega$, and Lm2=13.5 $\mu$H. Comparing FIG. 6(C) with FIG. 6(B) clearly indicates that, in FIG. (C), the frequency whereat the reactance component converges is higher than the other. If necessary, the third closed circuit or more may be prepared to raise the frequency. However, if the frequency is successfully raised to the resonance point of an inductance element, no more closed circuits will be necessary. In this embodiment, the resonance point is 120 MHz, so the third closed circuit is unnecessary.

As stated above, this embodiment accurately demonstrates characteristic of an inductance element, especially of an inductance element wherein ferrite material is used. Therefore, using the equivalent circuit of FIG. 1(A) in a simulator will make accurate simulations possible. In addition, connecting elements having the determined circuit constants as in FIG. 1(A) will make it possible to obtain an inductance element as desired.

Embodiment 2

Figure 7:
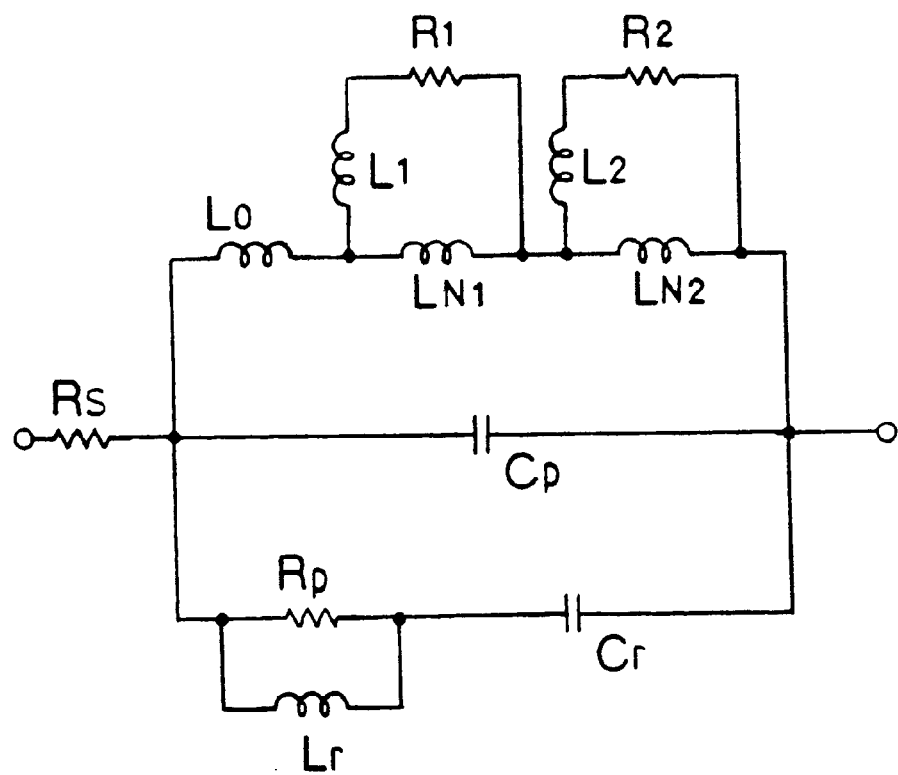
FIG. 7 is a diagram of an equivalent circuit of Embodiment 2.

Referring now to Embodiment 2, wherein the equivalent circuit shown in FIG. 7 is used. FIG. 7 shows an equivalent circuit to that of FIG. 1(A). The equivalent circuit of FIG. 1(A) has a structure wherein closed circuits are magnetically coupled to the equivalent circuit with mutual inductance. The value of mutual inductance is determined through the process stated above, but it is difficult to obtain the value of mutual inductance in an actual circuit. On the other hand, the equivalent circuit of FIG. 7 has no mutual inductance, so that it is more convenient and advantageous to use the equivalent circuit of FIG. 7 than one of FIG. 1(A) in actually connecting elements thereto.

Figure 8:
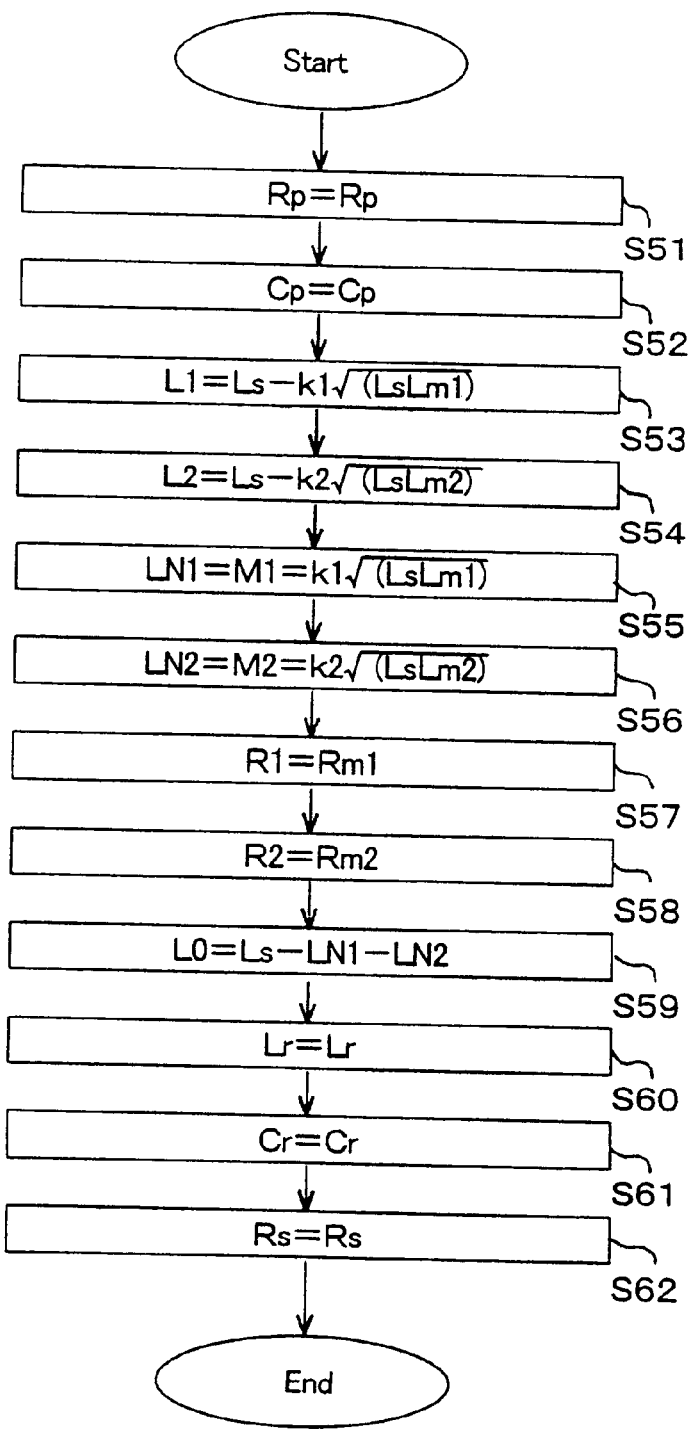
FIG. 8 is a flowchart explaining analysis process in said Embodiment 2.

The following explains the analysis process in the case that an inductance element having the same characteristic as shown in FIG. 20(B) is expressed by the equivalent circuit of FIG. 7. The analysis process is basically the same as in Embodiment 1. FIG. 8 shows the analysis process for Embodiment 2.

Figure 22A:
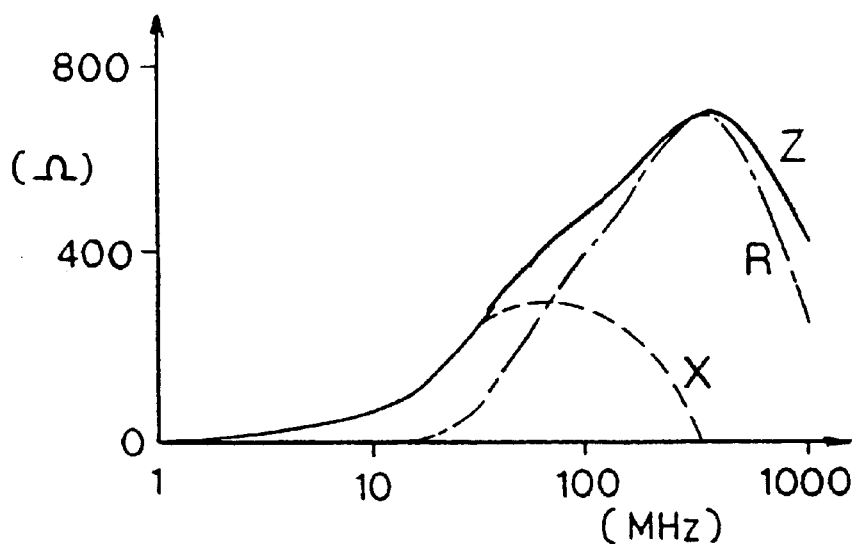
FIG. 22(A) is another example of impedance frequency characteristic of an inductance element.

First, the following values are obtained from the data in FIG. 22(A) through the same process as in Embodiment 1.

Ls=13.5 $\mu$H, Cp=0.37 pF, Lm1=13.5 $\mu$H, Rm1=635 $\Omega$, k1=0.67, L m2=13.5 $\mu$H, Rm2=2600 $\Omega$, k2=0.30, Rp=640 $\Omega$, Lr$\to\infty$, Cr$\to\infty$, Rs=0.28 $\Omega$ Then, the steps from S51 through S62 are carried out in order in FIG. 8. The following values are determined through the steps.

Rp=640 $\Omega$, Cp=0.37 pF, L1=4.5 $\mu$H, L2=9.45 $\mu$H, LN1=9 $\mu$H, LN2=4.05 $\mu$H, R1=635 $\Omega$, R2=2600 $\Omega$, Lo=−0.45 $\mu$H, Lr$\to\infty$, Cr$\to\infty$, Rs=0.28 $\Omega$ The frequency characteristic obtained by applying those circuit constants to the equivalent circuit of FIG. 7 agreed with FIG. 1(B). Comparing FIG. 1(B) with FIG. 20(B) that shows actual values clearly indicates that these two agree well with each other, and that Embodiment 2 is also an equivalent circuit of inductance element with high accuracy. Then, the equivalent circuit obtained though the above stated analysis process was mounted in inductance element 12 shown in FIG. 20(A), and simulations of signal waveforms of the circuit of FIG. 20(A) were conducted. Comparing FIG. 20(C), which is the simulation result, with FIG. 1(C) also clearly indicates that it is possible to conduct highly accurate simulations in Embodiment 2.

Figure 9A:
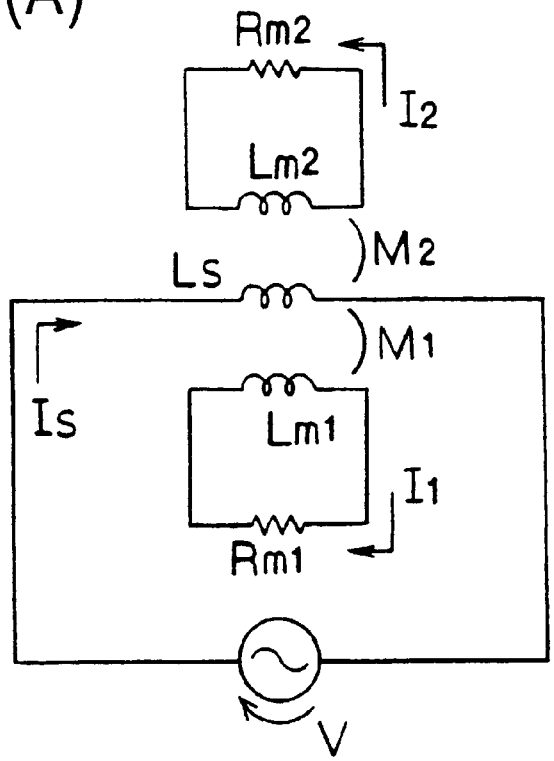
FIG. 9(A) and FIG. 9(B) are circuit diagrams to lead expressions shown in FIG. 8.

Expressions in steps S53 through S59 in FIG. 8 are given by the following process. First, as shown in FIG. 9(A), the part of a magnetic coupling circuit is taken out of the equivalent circuit of FIG. 1(A). Impedance value is given by Expression 22. Solving Expressions 22 yields Expression 23.

V=Ls(dI s/dt)+M1(dI1/dt)+M2(dI2/dt)

0=M1(dI s/dt)+Lm1(dI1/dt)+Rm1·I1

0=M2(dI s/dt)+Lm2(dI2/dt)+Rm2·I2

V=Zs·I s  Expression 22

Zs=j$\omega$Ls+$\omega^2$M1$^2$/(Rm1+j$\omega$Lm1)+
$\omega^2$M2/(Rm2+j$\omega$Lm2)  Expression 23

Figure 9B:
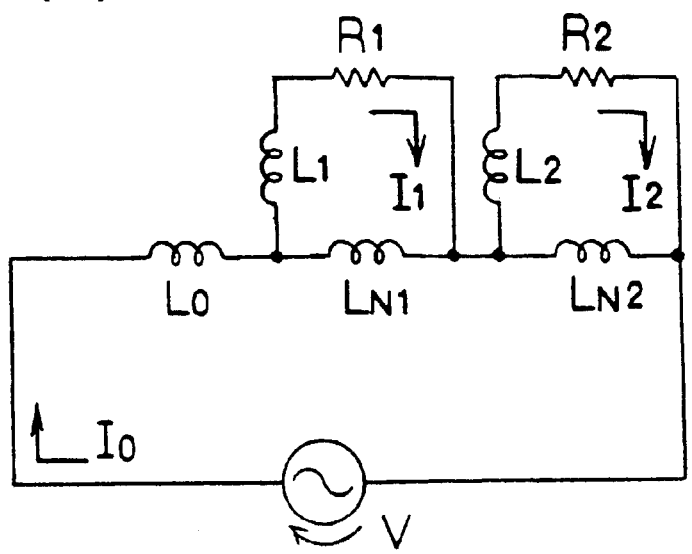

Then, the part of equivalent circuit of the magnetic coupling circuit is taken out of FIG. 7 as shown in FIG. 9(B). Impedance value of this circuit is given by Expression 24. Solving Expression 24 yields Expression 25.

V=L0(dI0/dt)+LN1((d(I0−I1))/dt)+LN2(d(I0−I2)/dt)

0=LN1(dI1−I0)/dt)+L1(dI1/dt)+R1·I1

0=LN2(dI2−I0)/dt)+L2(dI2/dt)+R2·I2

V=Z0·I0  Expression 24

$$Z0=j\omega(L0+LN1+LN2)+\omega^2 LN1^2/(R1+j\omega(L1+LN1))+\omega^2 LN2^2/(R2+j\omega(L2+LN2))$$ Expression 25

Comparing Expression 25 with Expression 23 leads to the expressions shown in steps S53 through S59.

Embodiment 3

Referring now to Embodiment 3, wherein an analysis method to realize an inductance element that has the characteristic shown in FIG. 22(A) in the equivalent circuit of FIG. 1(A) is explained. According to the characteristic shown in FIG. 22(A), the expression Z≈jX holds at 10 MHz. Accordingly, the value Ls=096 μH is found by substituting the values XL=60 Ω and fL=10 MHz in Expression Ls=XL/(2πfL). Then, the value Rp=1170 Ω is determined based on Ro=1170 Ω(the measured values at the resonance point) and Rp=Ro.

Next, the value Cp=0.09 pF is found by substituting the values Rh=530 Ω, Ls=0.96 μH, and Rp=1170 Ω, all of which are the measured values at the frequency fh=1.8 GHz, in Expression 5. The values of reactance component X for each frequency are calculated by substituting the values of Ls, Rp, and Cp in Expression 5. Then the measured values and the calculated values of reactance component X are compared with each other. The result showed a big difference between the two values, and the frequency fm1 wherein reactance component X should be decreased the most was 160 MHz. Therefore, as in Embodiment 1, the values Lm1=0.96 μH and Rm1=965 Ω are determined so that they satisfy the expression Rm1/Lm1=2π fm1.

Furthermore, the value of coupling coefficient k1=0.72 is found by substituting the values X1=580 Ω, which is a reactance value by LsCpRp parallel circuit at said frequency, and Xm1=430 Ω, which is a target value that should be decreased from the measured value, in the expression k1=√(2(1−Xm1/X1)). The reactance component X for each frequency was calculated by performing mathematical operations for Ls, Cp, Lm1, Rm1, and k1 by making use of Expression 7 through 10. After comparing the calculated values and the measured values for reactance component X, there was only a small difference between the two, so it was unnecessary to decrease the calculated values. Therefore, any values may be selected for Rm2 and Lm2. For example, suppose the following values are selected: Rm2=965 Ω, Lm2=0.96 μH, and k1=0.

Following the above stated process, the values of RL=470 Ω, XL=2000 Ω, and Bc=0.367 mS are found by substituting fo=650 MHz(the frequency at the resonance point) and the values of said circuit constants Ls, Cp, Lm1, Rm1, k1, Lm2, Rm2, and k2 in Expressions 16 through 18. The value Rp=1300 Ω is given based on Ro=1170 Ω that is the reactance component at the resonance point.

Next, in FIG. 22(A), the frequency, whereat the curves representing resistance component R and reactance component X of impedance Z cross, is about 120 MHz, and the frequency, whereat the value of reactance component X shows its maximum in FIG. 22(A), is about 90 MHz. As stated below, the values of Lr and Cr are determined by using those values of frequencies.

In FIG. 1(A), inductance Lr is connected to resistance Rp in parallel. Accordingly, resistance of the parallel circuit can be restrained until the frequency reaches the level whereat the value of impedance 2πfLr of inductance Lr exceeds the value of resistance Rp. This means that raise of resistance component of impedance of the parallel circuit can be restrained. Therefore, the value Lr=5.1 μH was found by substituting the values of frL=40 MHz, which is the frequency whereat the increase of resistance value of impedance should be curved, and Rp=1300 Ω in the expression Lr=Rp/(2πfLr).

Capacitance Cr is connected in series to the parallel circuit with inductance Lr and resistance Rp. Accordingly, the resistance will significantly grow when the frequency reaches the level whereat the value of impedance 1/(2πfCr) of capacitance Cr is less than the value of resistance Rp. So, the value Cr=1.2 pF was found by substituting the values of frC=100 MHz, which is the frequency whereat reactance component of impedance in LrRpCr circuit should exceed the resistance component, and Rp=1300 Ω in the expression Cr=1/(2πfrCRp). And, the value Rs=0.5 Ω is found because the measured value of direct current resistance was 0.5 Ω.

Figure 10:
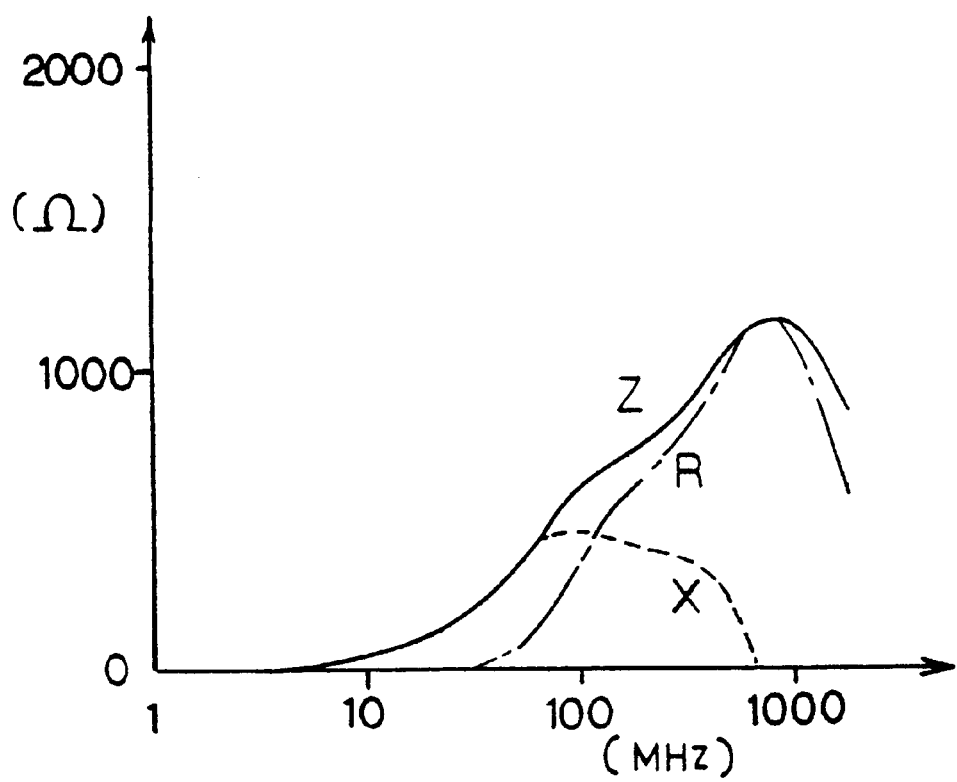
FIG. 10 is a graph showing frequency characteristic in Embodiment 3 and 4.

FIG. 10 shows the frequency characteristic of the equivalent circuit of FIG. 1(A) whereto the values of circuit constant calculated through the above stated process are applied. Comparing FIG. 10 with FIG. 22(A) that shows the measured values clearly indicates that the equivalent circuit of Embodiment 2 accurately demonstrates the frequency characteristic of an inductance element.

Embodiment 4

Referring now to Embodiment 4, wherein an inductance element that has the same characteristic as shown in FIG. 22(A) is analyzed by using the equivalent circuit of FIG. 7 and through the process as shown in FIG. 8. Through the same process as stated in Embodiment 3, the following values were determined:

Ls=0.96 μH, Cp=0.09 pF, Lm1=0.96 μH, Rm1=965 Ω, k1=0.72, L m2=0.96 μH, Rm2=965 Ω, k2=0, Rp=1300 Ω, Lr=5.1 μH, Cr=1.2 pF, Rs=0.5 Ω.

Then, the following values were found according to the steps S51 though S62 in FIG. 8:

Rp=1300 Ω, Cp=0.09 pF, L1=0.27 μH, L2=0.96 μH, LN1=0.69 μH, LN2=0 μH, R1=965 Ω, R2=965 Ω, Lo=0.27 μH, Lr=5.1 μH, Cr=1.2 pF, Rs=0.5 Ω.

The frequency characteristic of the equivalent circuit of FIG. 7 whereto the values of circuit constants obtained through the above stated process are applied agreed with FIG. 10. Therefore, the equivalent circuit by this embodiment demonstrates the frequency characteristic of an inductance element very accurately.

Embodiment 5

Figure 11A:
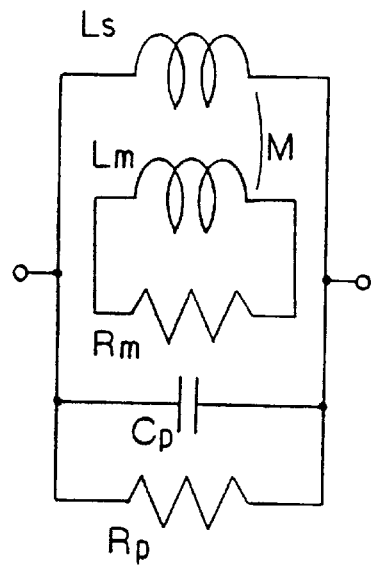
FIGS. 11(A), (B), and (C) relate to Embodiment 5.

Referring now to Embodiment 5, wherein a magnetic coupling circuit as shown in FIG. 11(A) is used as an equivalent circuit of inductance element wherein ferrite material is used. This circuit is a simplified variant of the equivalent circuit of FIG. 1(A), wherein a closed circuit with resistance Rm and inductance Lm in series is magnetically coupled to inductance Ls of LsCpRp circuit at coupling coefficient k to form mutual inductance M. Therefore, it is sufficient to make analysis considering the circuit constants that exist in the equivalent circuit of FIG. 1(A) but do not exist in the equivalent circuit of FIG. 11(A) as "zero."

Figure 12:
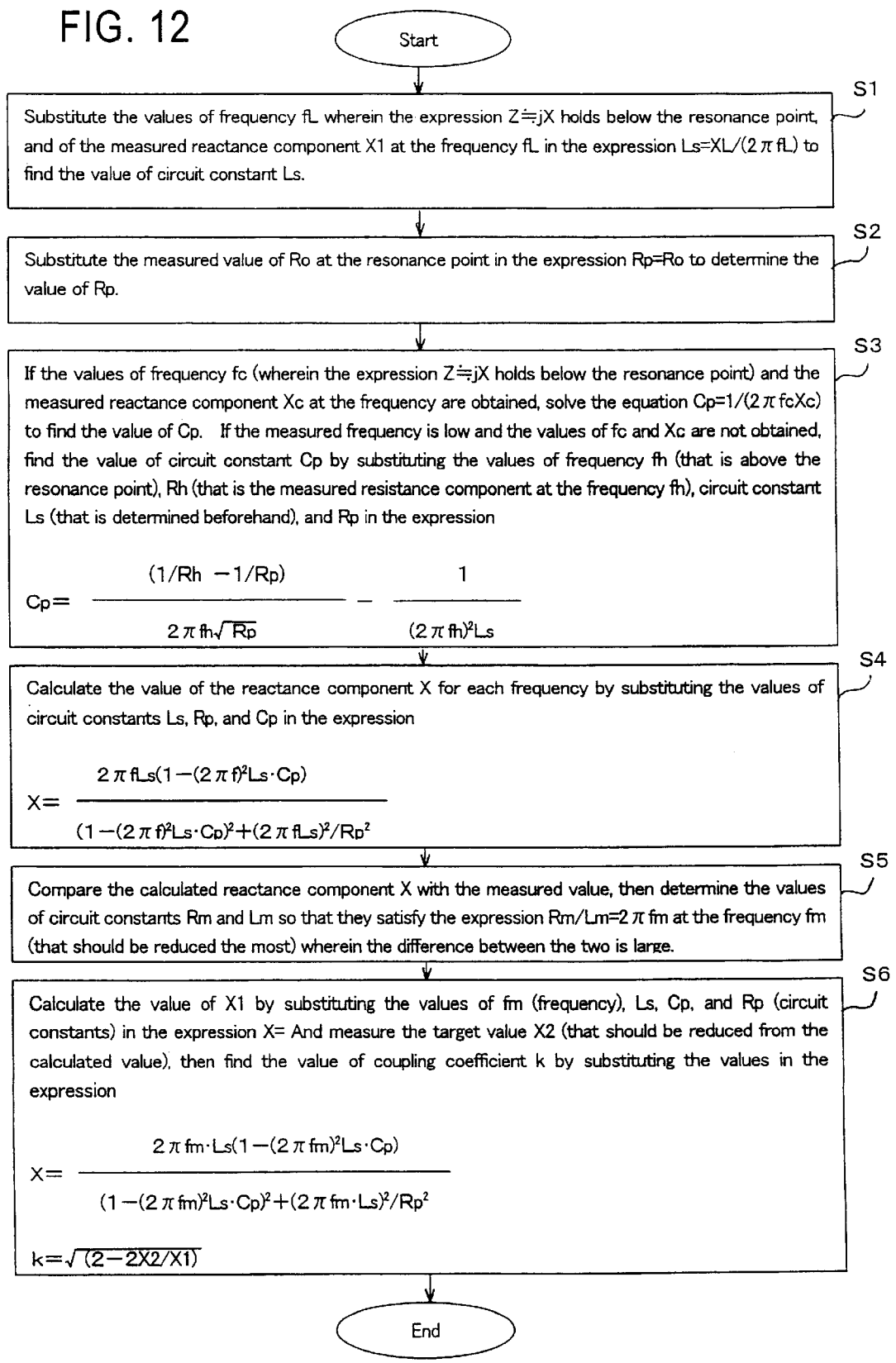
FIG. 12 is a flowchart explaining the analysis process in said Embodiment 5.

In this embodiment, circuit constants are determined according to the process as shown in FIG. 12. The following explains a determination process of circuit constants of the inductance element that has the same frequency characteristic as in FIG. 20(B), by using the equivalent circuit of FIG. 11(A) and according to the steps shown in FIG. 12.

(1) Determining the value of circuit constant Ls (Step S1) . . . The value of impedance XL of the entire inductance element is measured, then the value of circuit constant Ls is found by solving Expression 26, based on the measured value XL and the frequency fL whereat the expression Z≈jX holds in the frequency domain below the resonance point. In an example of FIG. 20(B), the expression Z≈jX held at 1 MHz, and the measured value XL was 17 Ω. So the value of circuit constant Ls=2.7 μH was found by substituting them in Expression 26.

$$Ls = XL/(2\pi fL) \qquad \text{Expression 26}$$

(2) Determining the value of circuit constant Rp (Step S2) . . . The value of circuit constant Rp is determined based on Ro (measured resistance component at the resonance point of the inductance element), and Rp=Ro. In this example, the value Rp=260 Ω was found based on the value Ro=260 Ω(measured value at the resonance point) and Rp=Ro.

(3) Determining the value of circuit constant Cp (Step S3) . . . The value of circuit constant Cp is determined by solving Expression 27 based on the measured value Xc and the frequency fC in the frequency domain wherein the expression Z≈jX holds and above the resonance point of the inductance element. If the measured frequency is low and the value of fC and Xc are not obtained, the value of circuit constant Cp is determined by solving Expression 28 based on the value of frequency fh, the measured value Rh, and the values of Ls and Rp, both of which are circuit constant determined beforehand, and all of which are found above the resonance point. In this example, the value Cp=0.65 pF was found by substituting the measured value Rh=124 Ω at fh=1 GHz, and the values of circuit constants Ls=2.7 μH, Rp=260 Ω in Expression 28.

$$Cp = 1/(2\pi fcXc) \qquad \text{Expression 27}$$

$$Cp = ((1/Rh - 1/Rp)/2\pi fh\sqrt{Rp}) - 1/(2\pi fh)^2 Ls \qquad \text{Expression 28}$$

(4) Determining the value of X, reactance of the entire equivalent circuit (Step S4) . . . The value of X, which is reactance component of an equivalent circuit for each frequency is calculated by substituting the value of Ls, Rp, and Cp in Expression 29. Based on the data obtained above, a graph showing changes of reactance component X for each frequency is obtained.

$$X = \frac{2\pi fLs(1 - (2\pi f)^2 LsCp)}{(1 - (2\pi f)^2 LsCp)^2 + (2\pi fLs)^2/Rp^2} \qquad \text{Expression 29}$$

(5) Determining the values of circuit constants Rm and Lm (Step S5). As stated above, when an inductance element is formed with ferrite material as stated above, phenomenon of magnetic resonance decreases the value of inductance. Therefore, in this embodiment, the decreased value of inductance is supplemented with the coupled equivalent circuit Lm, Rm. In other words, regarding the reactance component X, the values of Rm and Lm are determined at the frequency fm whereat difference between the calculated and measured value is large and decrease of the calculated value is preferable so that the values satisfy Expression 30. In this example, the value fm=15.3 MHz was found, so the values of Lm=2.7 μH and Rm=260 Ω are found based on Expression 30.

$$Rm/Lm = 2\pi fm \qquad \text{Expression 30}$$

(6) Determining the value of coupling coefficient k (Step S6) . . . The value of coupling coefficient value k is determined by substituting the value of X1, which is the reactance component X in LsCpRp parallel circuit at frequency fm, and the target value X2 in Expression 31. In this example, the value k=0.70 was found by substituting the values X=126 Ω and X2=95 Ω in Expression 31. The value of mutual inductance M is given by the expression $M = \sqrt{k/(LsLm)}$.

$$k = \sqrt{(2 - 2X2/X1)}$$

$$X2 = X1(1 - k^2/2) \qquad \text{Expression 31}$$

(7) Redetermining the value of circuit constant Rp . . . The values of RL, XL, and Bc are determined by substituting the values of fo(the frequency at the resonance point), Ls, Cp, Lm Rm, and k(all of them are circuit constants), in Expression 32 through 34. Then, the value of Rp is redetermined by substituting the value of Ro, resistance component of impedance, in Expression 35.

$$RL = \frac{(2\pi f_0 \cdot k)^2 Rm \cdot Ls/Lm}{(2\pi f_0)^2 + (Rm/Lm)^2} \qquad \text{Expression 32}$$

$$XL = 2\pi fo \cdot Ls(1 - (2\pi fo \cdot k)^2/((2\pi fo)^2 + (Rm/Lm)^2)) \qquad \text{Expression 33}$$

$$Bc = 2\pi foCp \qquad \text{Expression 34}$$

$$Rp = Ro/(1 - Bc \cdot Ro \cdot RL/XL) \qquad \text{Expression 35}$$

Figure 11B:
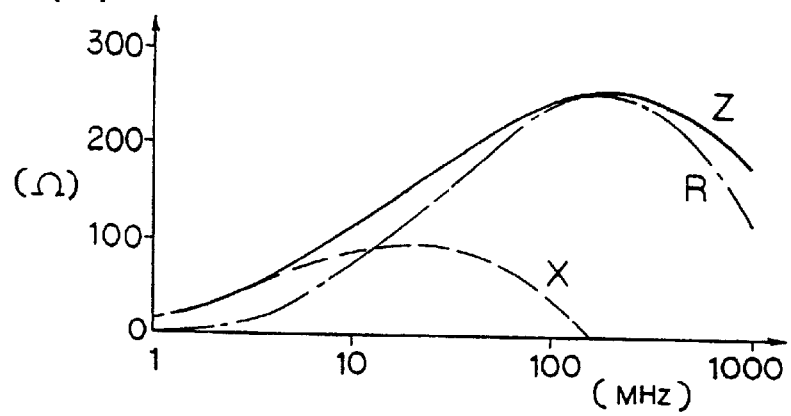
FIG. 11(B) shows a characteristic example of the equivalent circuit.

The frequency characteristic found by applying the circuit constants obtained through the above stated process to the equivalent circuit shown in FIG. 11(A) is shown in FIG. 11(B). Comparing FIG. 11(B) with FIG. 20(B) indicates that these two graphs almost agree with each other and that the analysis method stated in this embodiment is quite accurate.

Figure 11C:
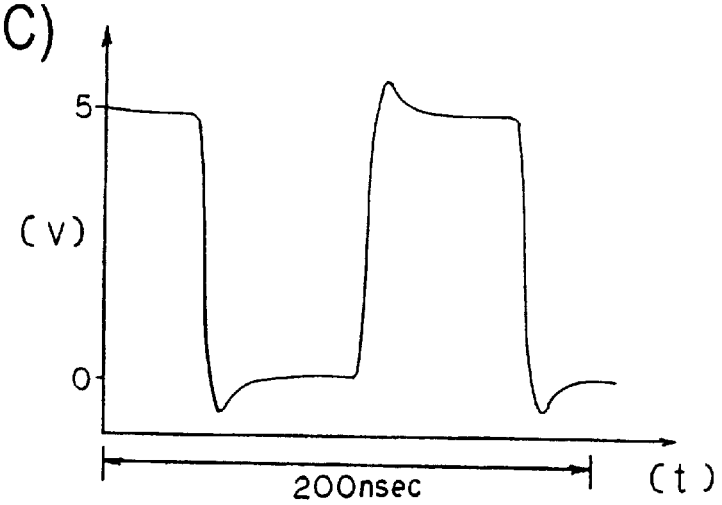
FIG. 11(C) is an example diagram of voltage waveform when using the equivalent circuit.

Next, simulating the signal waveform at the measurement point PD in the case of inputting pulse signal SA after applying the equivalent circuit obtained through the above analysis results to inductance 12 in the signal line shown in FIG. 20(A) results in the waveform shown in FIG. 11(C). Comparing FIG. 11(C) with FIG. 20(C) indicates that this embodiment enables very high accurate simulation to happen.

Figure 13A:
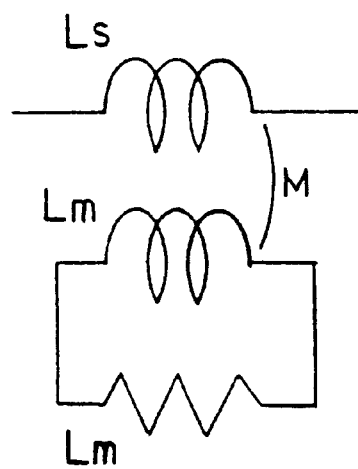
FIG. 13(A) and FIG. 13(B) are diagrams to lead Expressions in FIG. 12.

Expression 30 (Rm/Lm=2πfm), which is an expression to determine the circuit constants of said closed circuit with resistance Rm and inductance Lm and explains relation between Rm and Lm to get the maximum effect out of the closed circuit, is given by the following process. First, the part of closed circuit that is shown in FIG. 13(A) is taken out. Inductance L of the closed circuit is given by Expression 36.

$$L = Ls(1 - (2\pi f)^2 k^2)/((2\pi f)^2 + (Rm/Lm)^2) \qquad \text{Expression 36}$$

Figure 13B:
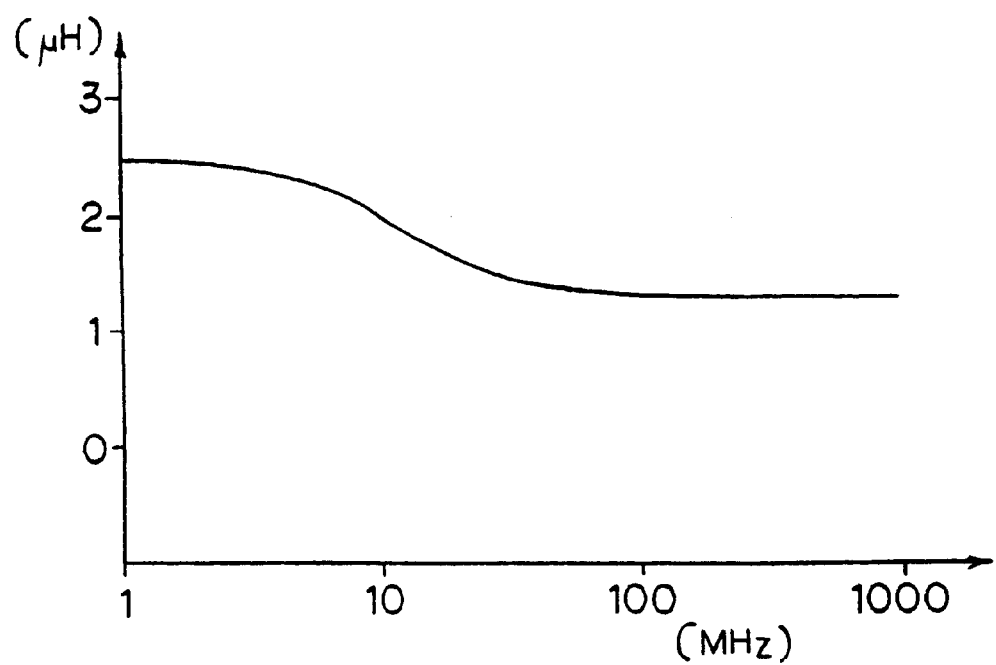

FIG. 13(B) shows the frequency characteristic of inductance L given by substituting the values Ls=2.7 μH, k=0.7, Rm=260 Ω, and Lm=2.7 μH in Expression36. In FIG. 13(B), the steepest inclination of the graph is determined by one-time differentiation of Expression 36 with frequency expressed by logarithm function, and is given by Expression 37.

$$-2k^2(2\pi f)^2(Rm/Lm)^2 Ls/((2\pi f)^2 + (Rm/LM)^2)^2 \qquad \text{Expression 37}$$

Another differentiation of Expression 37 and finding the conditions wherein the variation is "zero" yield Expression 30, $2\pi f=Rm/Lm$. Inductance L2 at the frequency whereat the conditions are satisfied is given by Expression 38 that is found by substituting Expression 30 in Expression 36. Furthermore, multiplying both sides of Expression 38 by the frequency yields Expression 31($X2=X1(1-k^2/2)$), which is an expression regarding coupling coefficient k.

$$L2=Ls(1-k^2/2) \quad \text{Expression 38}$$

Figure 14A:
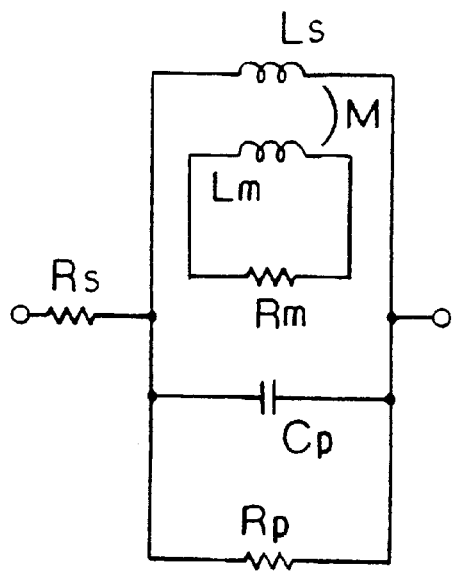
FIG. 14(A) through FIG. 14(C) are circuit variations of said Embodiment 5.
Figure 14C:
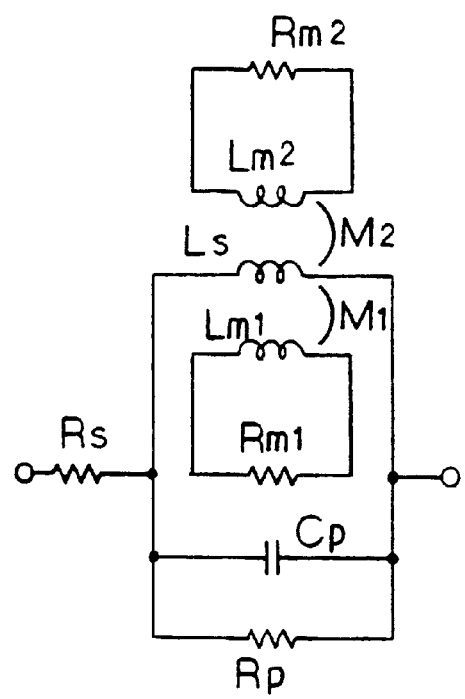
Figure 14B:
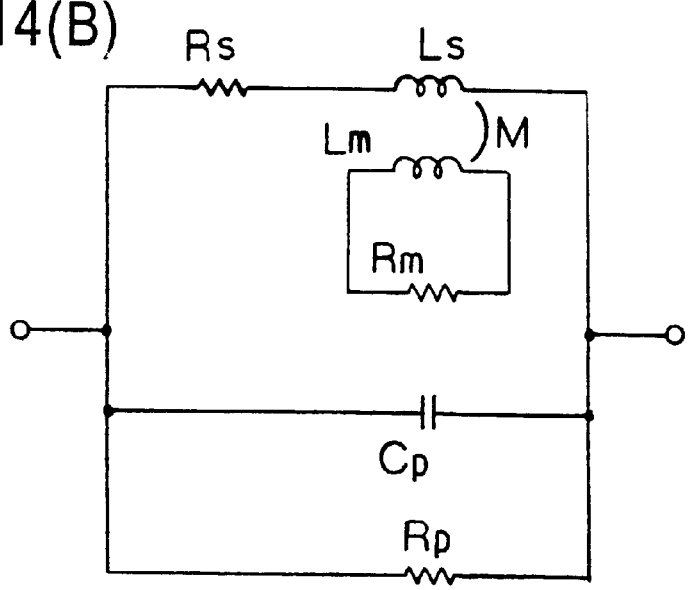

In the case of analyzing values of direct current resistance component of inductance 12 (See FIG. 20(A)) in Embodiment 5, it is preferable to use the equivalent circuit whereto resistance Rs as shown in FIGS. 14(A) and (B) is connected. If it is necessary to fall off the value of reactance component X of impedance Z of inductance element 12 at plural frequencies, it is preferable to mount plural number of closed circuits that are inductively coupled to the equivalent circuit as shown in FIG. 14(C).

Embodiment 6

Figure 15A:
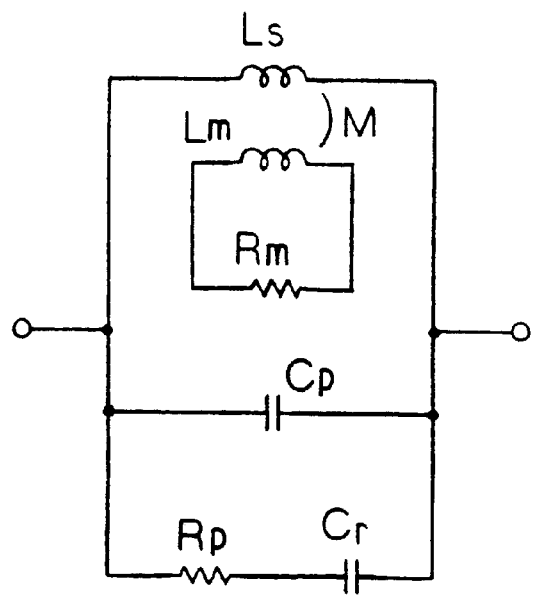
FIGS. 15(A) and (B) relate to Embodiment 6.

Referring now to Embodiment 6, wherein an inductance element that has a characteristic as shown in FIG. 22(A) is analyzed, by making use of the equivalent circuit of FIG. 15(A). The equivalent circuit of FIG. 15(A) is different from the equivalent circuit of Embodiment 5 as shown in FIG. 11(A), in that capacitance Cr is connected in series to resistance Rp in FIG. 15(A),.

First, based on $Z \approx jX$ at 4 MHz, $Ls=0.56$ μH is found by substituting the values, $XL=14$ Ω and $fL=4$ MHz in Expression 39.

$$Ls=XL/(2\pi fL) \quad \text{Expression 39}$$

Next, based on the measured value $Ro=350$ Ω at the resonance point, $Rp=350$ Ω is found by the equation $Rp=Ro$.

Then, $Cp=0.57$ pF is found by substituting the values, $Rh=50$ Ω, $Ls=0.56$ μH, and $Rp=350$ Ω, all of which are measured values at the frequency $fh=1$ GHz, in Expression 40.

$$Cp=\sqrt{(1/Rh-1/Rp)}/2\pi fh\sqrt{Rp}+1/(2\pi fh)^2 Ls \quad \text{Expression 40}$$

Next, an expression regarding reactance component X at each frequency is given by substituting the values Ls, Rp, and Op in Expression 41.

$$X = \frac{2\pi fLs(1-(2\pi f)^2 LsCp)}{(1-(2\pi f)^2 LsCp)^2 + (2\pi fLs)^2/Rp^2} \quad \text{Expression 41}$$

Then, find the frequency that should be decreased the most because there is a big difference between the value of reactance component X and the measured value in FIG. 22(A). In this example, because the value $fm=110$ MHz was found, the values $Lm=0.56$ μH and $Rm387$ Ω were determined, so that they satisfy the expression $Rm/Lm=2\pi fm$. In addition, the value of coupling coefficient $k=0.70$ is found by substituting the values $X1=169$ Ω(the value of reactance component in LsCpRp parallel circuit at the frequency fm), and $X2=128$ Ω(the target value obtained by decreasing the measured value) in the expression $k=\sqrt{(2-2X2/X1)}$.

Next, the values $RL=170$ Ω, $XL=632$ Ω, and $Bc=1.15$ mS are given by substituting the frequency at the resonance point $fo=320$ MHz, and the values of circuit constants, Ls, Cp, Lm, Rm, and k in Expression 42. Then, the value $Rp=392$ Ω is redetermined by substituting the value $Ro=350$ Ω (resistance of impedance Z) in Expression 43.

$$RL = \frac{(2\pi f_0 k)^2 RmLs/Lm}{(2\pi f_0)^2 + (Rm/Ls)^2} \quad \text{Expression 42}$$

$$X_L = 2\pi f_0 Ls\left(1 - \frac{(2\pi f_0 k)^2}{(2\pi f_0)^2 + (Rm/Lm)^2}\right)$$

$$Bc = 2\pi f_0 Cp$$

$$Rp=Ro/(1-BcR0RL/XL) \quad \text{Expression 43}$$

Next, the value $Cr=12.5$ pF is found by solving the expression $Cr=1/(Lsfr^2)$ because the measured value of frequency $fr=60$ MHz whereat the reactance component X of impedance Z shows its maximum in FIG. 22(A).

Figure 15B:
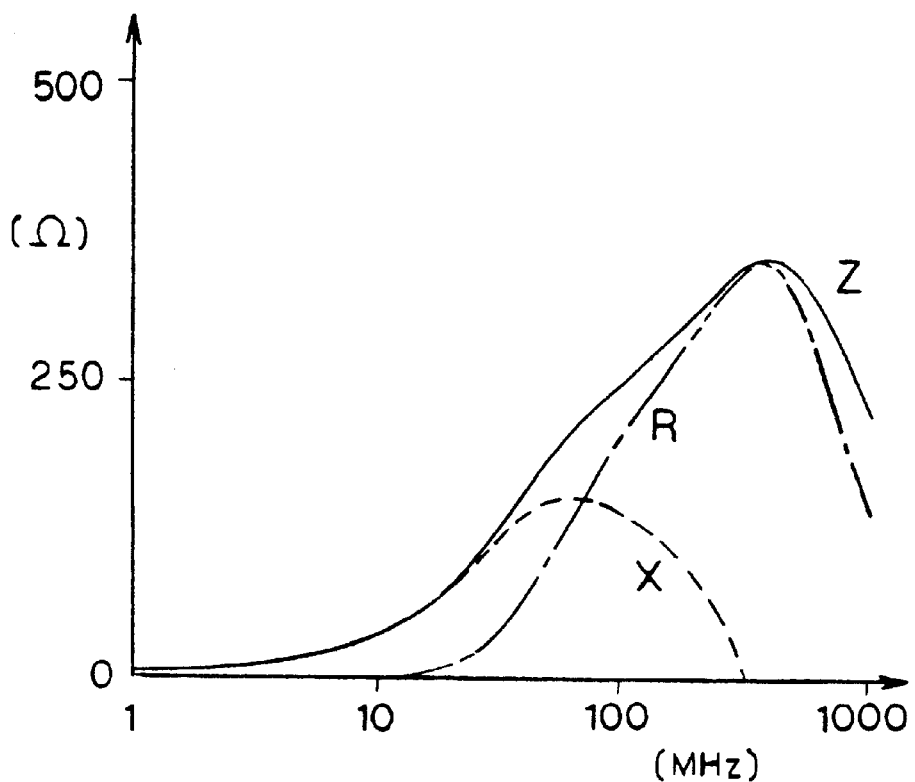
FIG. 15(B) is a graph showing an example characteristic of the circuit.

In this embodiment, capacitance Cr that is connected in series to resistance Rp, and inductance Ls cause parallel resonance. This amplifies the value of reactance component X around the resonance point. FIG. 15(B) shows the frequency characteristic in the case that the above stated circuit constants are applied to FIG. 15(A). Comparing FIG. 15(B) with FIG. 22(A) that shows measured values clearly indicates that this embodiment demonstrates the characteristic of inductance element with high accuracy.

Figure 16A:
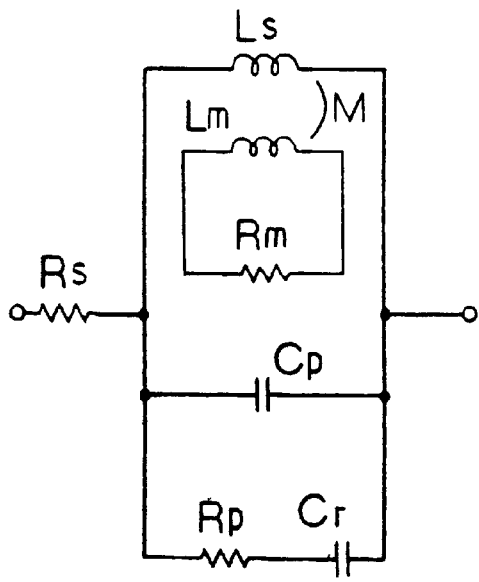
FIG. 16(A) through FIG. 16(C) are circuit variations of said Embodiment 6.
Figure 16C:
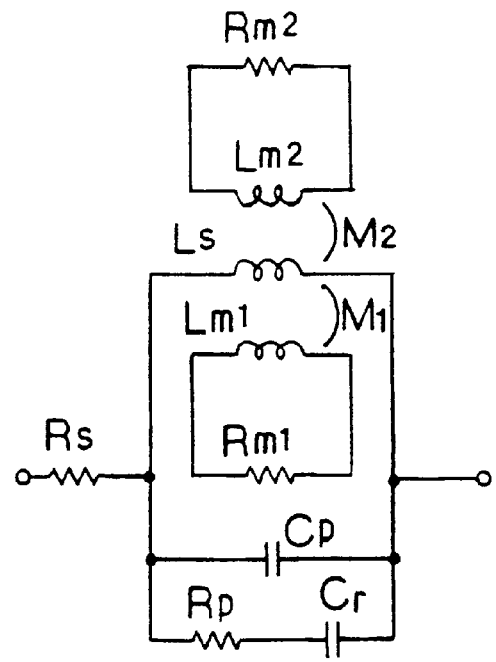
Figure 16B:
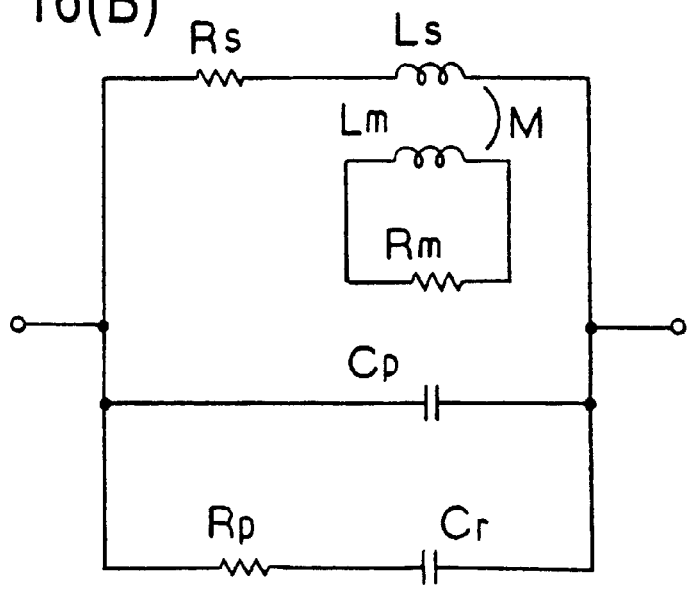

For analyzing direct current of the inductance element in this embodiment, it is preferable to use the equivalent circuit whereto resistance Rs as shown in FIGS. 16(A) and (B) is connected. If it is necessary to attenuate reactance component X at plural frequencies, mounting plural number of inductive coupled closed circuits may be preferable, as in FIG. 16(C).

Embodiment 7

Figure 17A:
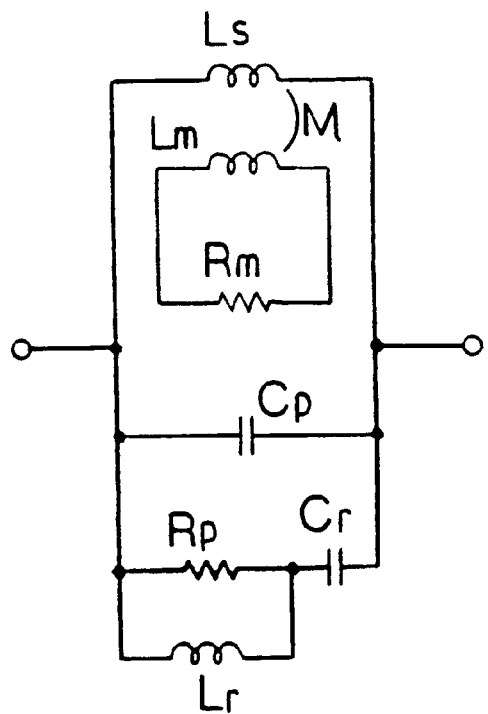
FIGS. 17(A) and (B) relate to Embodiment 7.
Figure 22B:
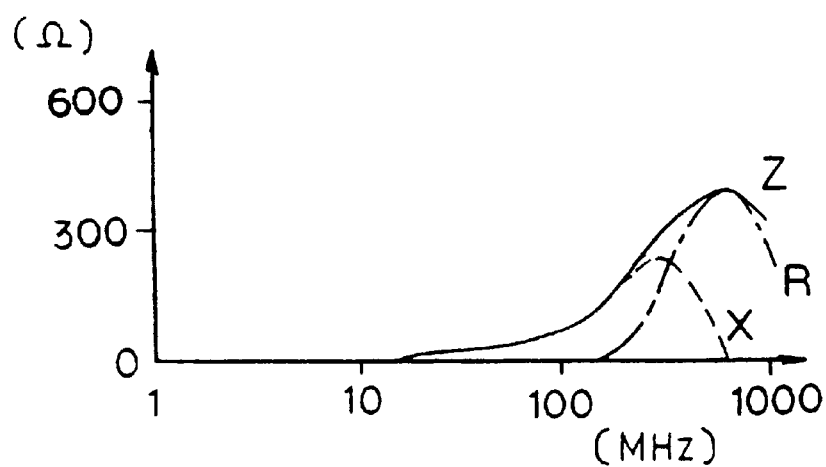
FIG. 22(B) is an analysis example carried out by prior arts.

Referring now to Embodiment 7, wherein an inductance element that has a characteristic shown in FIG. 22(B) is analyzed, by making use of the equivalent circuit of FIG. 17(A). The equivalent circuit of FIG. 17(A) is different from the equivalent circuit of FIG. 15(A) in Embodiment 6, in that in FIG. 17(A), inductance Lr is connected to resistance Rp in FIG. 17(A).

In FIG. 22(B), the expression $Z \approx jX$ holds at 100 MHz. So, the value $Ls=0.105$ μH is found by substituting the values $XL=66$ Ω and $fL=100$ MHz in the expression $Ls=XL/(2\pi fL)$. Based on the measured value at the resonance point $Ro=380$ Ω, and $Rp=Ro$, the value $Rp=380$ Ω is determined.

Then, the value $Cp=0.52$ pF is found by substituting the values $Rh=260$ Ω, $Ls=0.105$ μH and $Rp=380$ Ω, all of which are the measured value at $fh=1$ GHz, in Expression 44.

$$Cp=\sqrt{(1/Rh-Rp)}/2\pi fh\sqrt{Rp}+1/(2\pi fh)^2 Ls \quad \text{Expression 44}$$

Next, the expression that explains reactance component X at each frequency is found by substituting the above values Ls, Rp, and Cp in Expression 45.

$$X = \frac{2\pi fLs(1-(2\pi f)^2 LsCp)}{(1-(2\pi f)^2 LsCp)^2 + (2\pi fLs)^2/Rp^2} \quad \text{Expression 45}$$

Then, compare the graph representing reactance component X with the graph of FIG. 22(B) representing measured value. If there is a big difference between the two graphs, find the frequency whereat the reactance component should be reduced the most. In this example, the value of $fm=600$ MHz (frequency to be decreased most) was found, so the values $Lm=0.105$ μH and $Rm=395$ Ω were determined, so that they satisfy the expression $Rm/Lm=2\pi fm$. In addition, the value of coupling coefficient k=0.50 was found by substituting the values X1=47 Ω (the reactance component of LsCpRp parallel circuit at frequency fm) and X2=41 Ω (the target value that should be decreased form the measured value) in the expression k=√(2−2X2/X1).

Then, the values RL=57.1 Ω, XL=339 Ω, and Bc=2.29 mS were found by substituting the value fo=700 MHz (frequency at the resonance point) and the values of above circuit constants Ls, Cp, Lm, Rm, k in Expression 46. Furthermore, the value Rp=445 Ω was redetermined by substituting Ro=380 Ω (the resistance component of impedance) in Expression 47.

$$RL = \frac{(2\pi f_0 k)^2 RmLs/Lm}{(2\pi f_0)^2 + (Rm/Lm)^2}$$ Expression 46

$$XL = 2\pi f_0 Ls\left(1 - \frac{(2\pi f_0 k)^2}{(2\pi f_0)^2 + (Rm/Lm)^2}\right)$$

$$Bc = 2\pi f_0 Cp$$

$$Rp=Ro/(1-BcRo\ RL/XL)$$ Expression 47

Then, the value Lr=0.39 μH was found by substituting the values frL=180 MHz (the frequency whereat increase of the value of resistance component of impedance should be restrained), and Rp=445 Ω in the expression Lr=Rp/(2πfrL). Finally, Cr=0.99 pF was found by substituting the values frc=360 MHz(the frequency whereat the value of the reactance component X of impedance Z should be kept large) and Rp=445 Ω in the expression Cr=1/(2πfrcRp). In this embodiment, resistance is kept low and increase of resistance component R of impedance Z is restrained in the frequency domain wherein the value of impedance 2πfLr of inductance Lr exceeds the value of resistance Rp because, in this embodiment, inductance Lr connects to resistance Rp in parallel.

In addition, resistance grows rapidly after the frequency reaches the level wherein 1/(2πfCr), which is the value of impedance of capacitance Cr connected in series, becomes lower than the value of resistance Rp, and reactance component X of impedance Z is large up to the frequency.

Figure 17B:
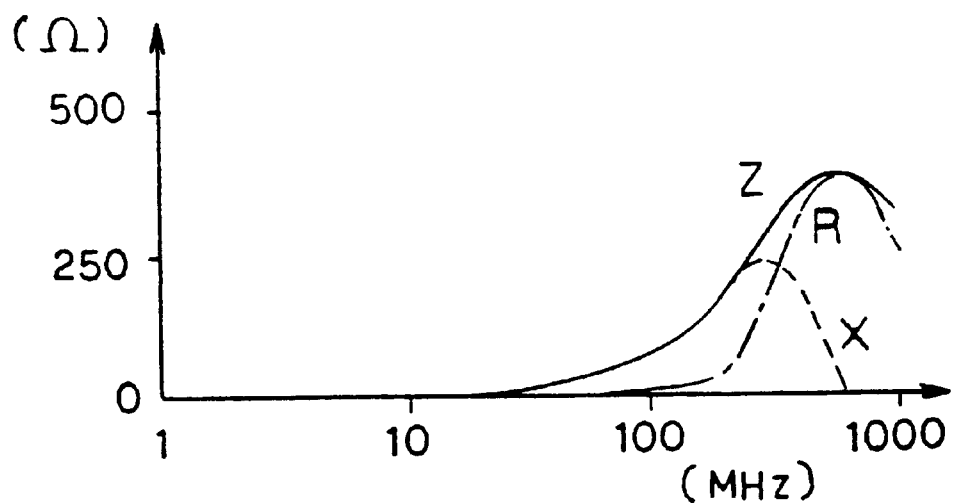
FIG. 17(B) is a graph showing an example characteristic of the circuit.

FIG. 17(B) shows the frequency characteristic of the equivalent circuit of FIG. 17(A) whereto said circuit constants are applied. Comparing FIG. 17(B) with FIG. 22(B) clearly indicates that this embodiment makes highly accurate analysis of an inductance element possible.

Figure 18A:
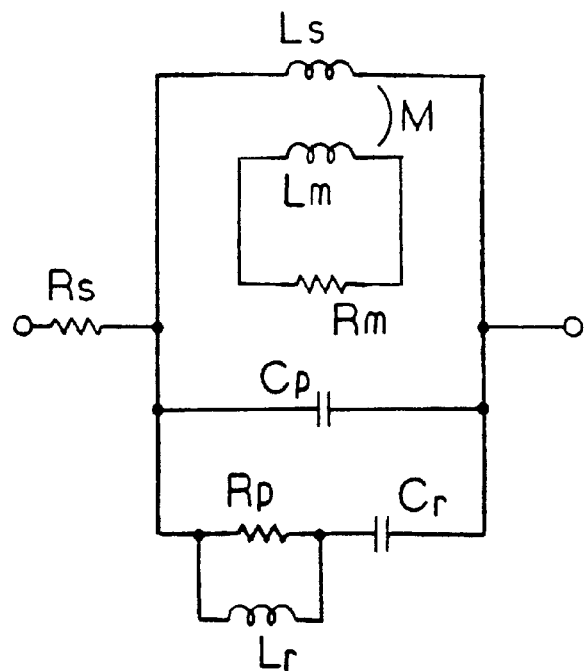
FIG. 18(A) and FIG. 18(B) are circuit variations of said Embodiment 7.
Figure 18B:
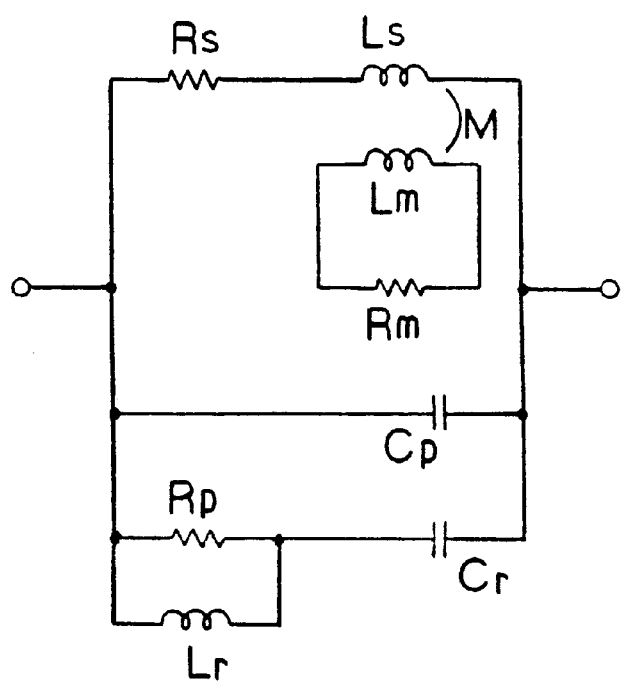

In this embodiment, it is preferable to use the equivalent circuit whereto resistance Rs is connected as shown in FIGS. 18(A) and (B). If it is necessary to reduce the value of reactance component X at plural frequencies, mounting plural number of magnetic coupling closed circuits as in FIG. 1(A) may be preferable.

Embodiment 8

Referring now to Embodiment 8 that is a simulator for frequency characteristic of an inductance element, making use of said analysis method. Using said analysis method will make it possible to simulate frequency characteristic of impedance of an inductance element with computer systems.

Figure 19:
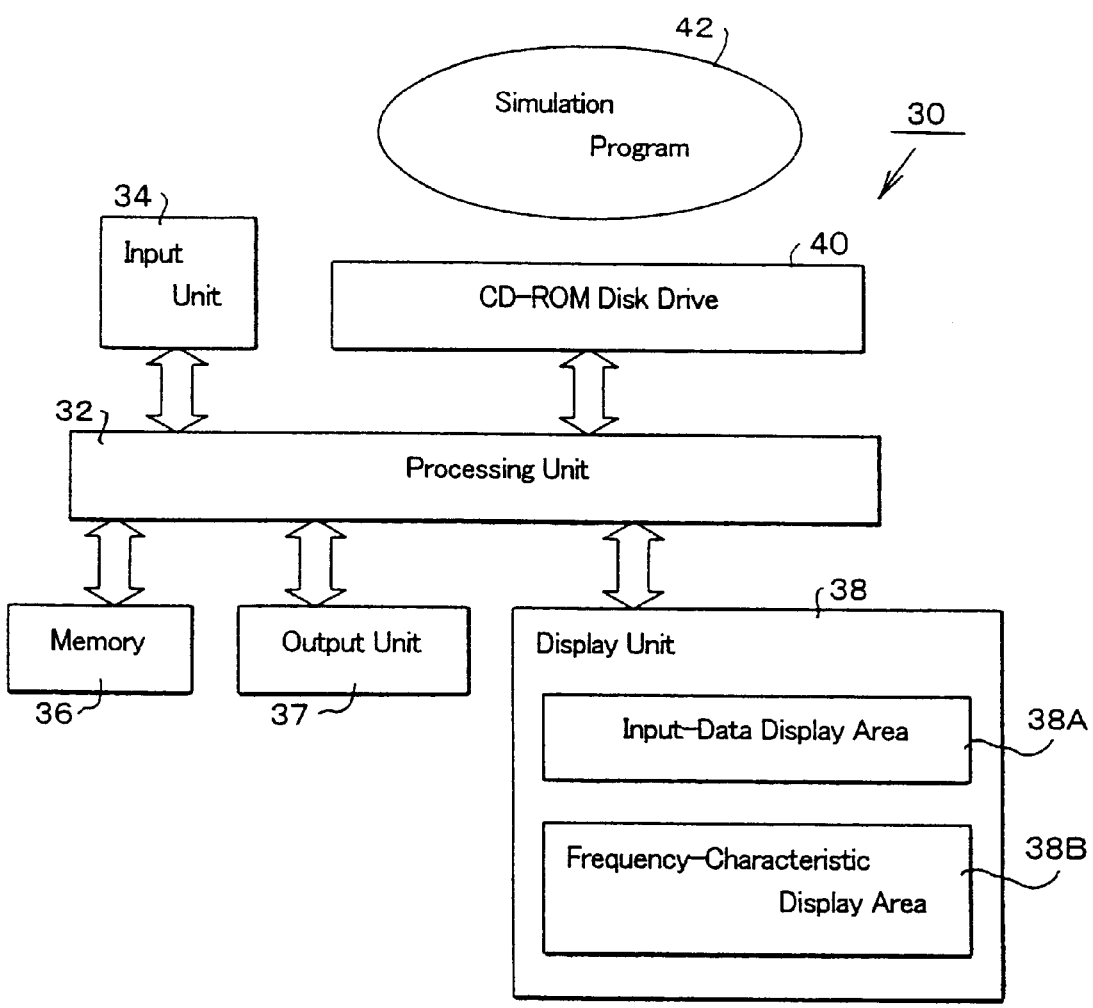
FIG. 19 is a block diagram showing structure of Embodiment 8.
Figure 21A:
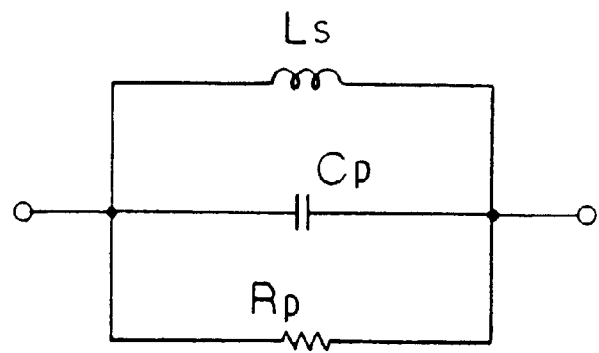
FIG. 21(A) and FIG. 21(B) relates to prior arts.
Figure 21B:
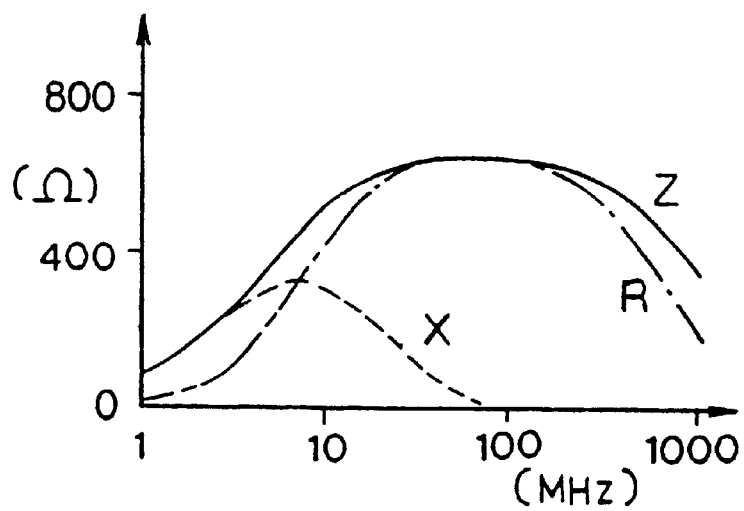

FIG. 19 shows the structure of such simulator. In FIG. 19, simulator 30 is equipped with processing unit 32 consisting of a central processing unit and the like, input unit 34 consisting of a keyboard, a mouse, and the like, memory 36, display unit 38, CD-ROM disk drive 40, and output unit 37.

A simulation program to perform said analysis method is stored in CD-ROM 42, which is a record medium that computers can read. When the CD-ROM 42 is placed in CD-ROM disk drive 40, the simulation program is loaded and carried out in processing unit 32. Display unit 38 has input-data-display area 38A and frequency-characteristic-display area 38B. Users input data, such as measured values, through the input unit 34, and see input-data-display area 38A at the same time. The input data are stored in the memory 36 and displayed on the input-data-display area 38A in the display unit 38.

Processing unit 32 performs said mathematical operations based on input data. If the values of impedance Z of a reactance element, resistance component R, frequency characteristic of reactance component X are found, the graph representing the values is displayed on the frequency-characteristic-display area 38B in the display unit 38. Looking at the graph, users input more data, or make corrections of the input data, if necessary.

The following explains the simulation process in the case of Embodiment 1. A user inputs the measured values of step S10 through S18 through input unit 34. Processing unit 32 performs mathematical operations on the input data according to steps S10 through S20. These mathematical operations yield the frequency characteristic of reactance component X, which is displayed on the display unit 38. Looking at the displayed results, the user select the necessary steps from step S22 to S26, and input necessary values. Based on the input data, processing unit 32 performs mathematical operations of steps S28 to S30. These mathematical operations yield the frequency characteristic of corrected reactance component X, which is displayed on display unit 38.

Looking at the displayed results, the user select the necessary steps from step S32 to S36, and input necessary values. Based on the input data, the processing unit 32 performs mathematical operations from steps S38 to S48. These mathematical operations finally yield the frequency characteristics of impedance Z, resistance component R, and reactance component X, which are displayed on the display unit 38. The finally fixed circuit constants are printed out of the output unit 37.

Embodiment 9

Figure 23:
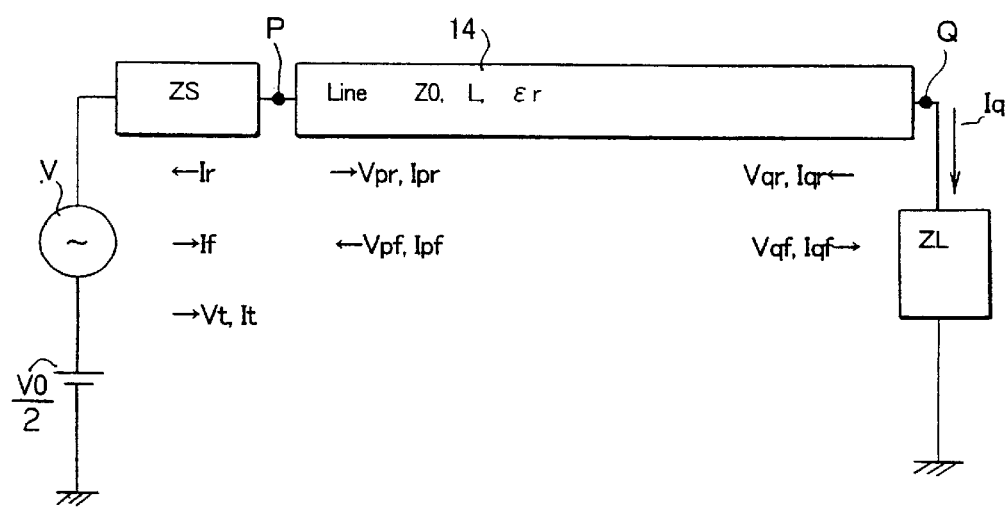
FIG. 23 is a circuit diagram showing an example of transmission line.

Next, referring to simulators of waveforms of a transmission line and simulation methods of a transmission line wherein said equivalent circuit of inductance element and analysis methods thereof is used. Assuming that there is a circuit as a transmission line including an inductance element whereto impedance ZS and ZL are connected to line 14 as shown in FIG. 23. In this circuit, V0 is the part of direct current of input signal, V is the part of alternating current of input signal, ∈r is the effective dielectric constant of line 14, Z0 is the characteristic impedance of line 14, and L is the length of line 14. In addition, ZS is output impedance, and ZL is input impedance (load impedance).

The relation between voltage and electric current at the points P and Q on line 14 is given by Expression 48. In Expression 48, Vpf is electric potential of incident wave, Ipf is electric current of incident wave, Vpr is electric potential of reflected wave, and Ipr is electric current of reflected wave, all of which are measured at the point P. In addition, Vqf is electric potential of incident wave, Iqf is electric current of incident wave, Vqr is electric potential of reflected wave, Iqr is electric current of reflected wave, all of which are measured at the point Q. And, Vt is electric voltage of transmission wave of line 14, ⌈p is reflection coefficient at the point P, ⌈q is reflection coefficient at the point Q, and A is phase shift between input and output. In this relation, Vt (electric voltage of the transmission wave of line 14) is given by the following expression (one of the expressions in Expression 48) that consists of output impedance Zs, Z0 (characteristic impedance of line 14), and V (the part of alternating current of input signal).

$$Vqr = \Gamma q Vqf$$

$$Vqf = A(\Gamma p A Vqr + Vt)$$

$$Vq = Vqr + Vqf$$

$$Vq = A(1+\Gamma q)Vt/(1-A^2\Gamma q \Gamma p)$$

$$iq = iqf - iqr$$

$$Z0 = Vqf/iqf = Vqr/iqr$$

$$iq = A(1+\Gamma q)Vt/((1-A^2\Gamma q \Gamma p)Z0)$$

$$Vt = Z0 \cdot V/(Zs+Z0) \qquad \text{Expression 48}$$

Furthermore, an inductance element is connected in series to output impedance ZS. The value of impedance of this inductance element, Z1=R1+jX1, is found by said embodiment. Voltage waveform Vq, voltage spectrum Va, current waveform Iq, current spectrum Ia, all of which are measured at the point Q of line 14, are given by Expression 49. Using these expressions will enable simulations to be carried out on output waveform of a signal line whereto an inductance element is added.

$$\omega = n\omega 0 (n=1,3,5,7) \qquad \text{Expression 49}$$

$$Vq = (V0/2) + (2V0/\pi) \cdot$$

$$\sum_{n}^{N} \{(1/n)|(A(1+\Gamma q)/(1-A^2\Gamma q \Gamma p) \cdot (Z0/(Zs+Z0))| \cdot$$

$$\sin(\omega t + \theta)(1/2)(\cos n\pi/N + 1)\}$$

Letting $(A(1+\Gamma q)/(1-A^2\Gamma q \Gamma p) \cdot (Z0/(Zs+Z0)) = \alpha + j\beta$, the equation $\theta = \tan^1(\beta/\alpha)$ holds.
If $\alpha < 0$, the equation $\theta = \pi + \tan^{-1}(\beta/\alpha)$ holds.

$$|Vq| = (2V0/\pi n)|(A(1+\Gamma q)/(1-A^2\Gamma q \Gamma p) \cdot (Z0/(Zs+Z0))|$$

$$Iq = (2V0/\pi) \cdot$$

$$\sum_{n}^{N} \{(1/n)|(A(1+\Gamma q)/(1-A^2\Gamma q \Gamma p) \cdot (1/(Zs+Z0))| \cdot$$

$$\sin(\omega t + \theta)(1/2)(\cos n\pi/N + 1)\}$$

Letting $(A(1+\Gamma q)/(1-A^2\Gamma q \Gamma p) \cdot (1/(Zs+Z0)) = \alpha + j\beta$, the equation $\theta = \tan^{-1}(\beta/\alpha)$ holds.
If $\alpha < 0$, the equation $\theta = \pi + \tan^{-2}(\beta/\alpha)$ holds.

$$|Iq| = (2V0/\pi n)|(A(1+\Gamma q)/(1-A^2\Gamma q \Gamma p) \cdot (1/(Zs+Z0))|$$

Figure 24:
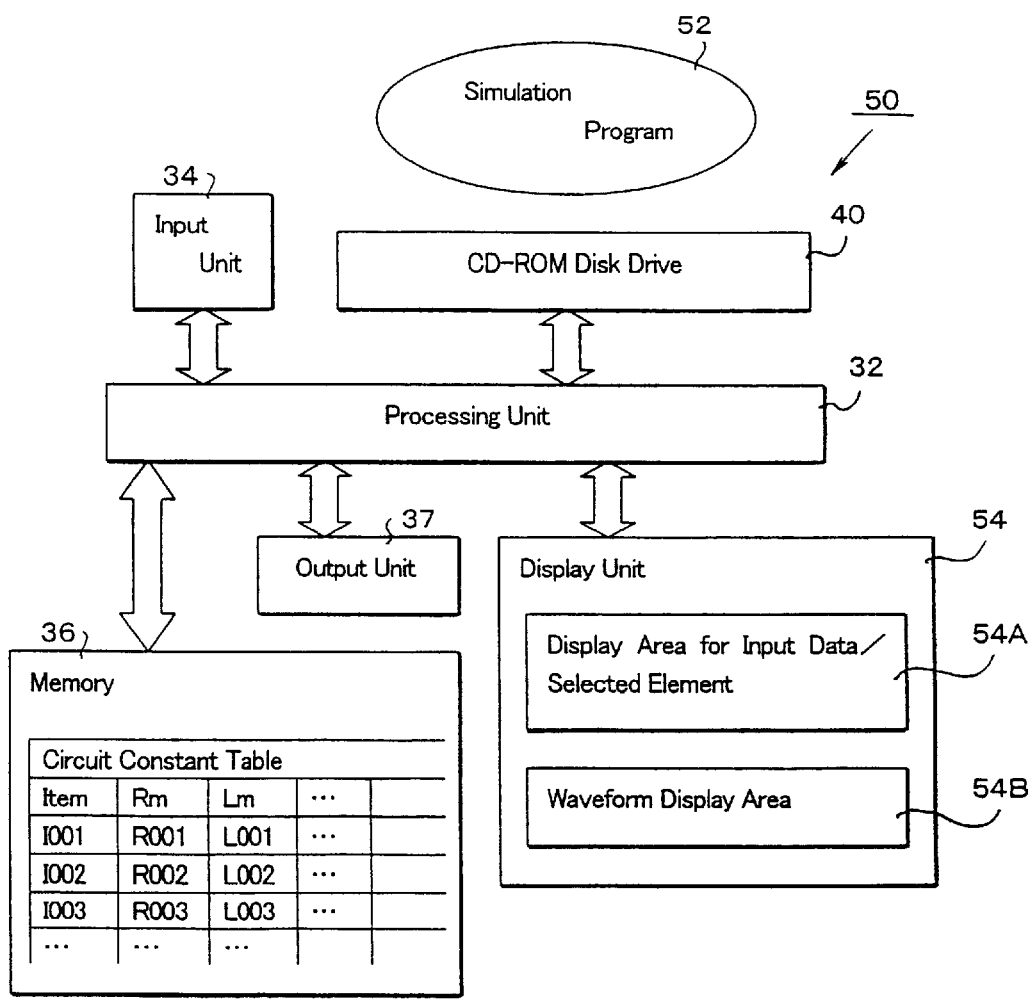
FIG. 24 is a block diagram showing the structure of Embodiment 9.
Figure 25:
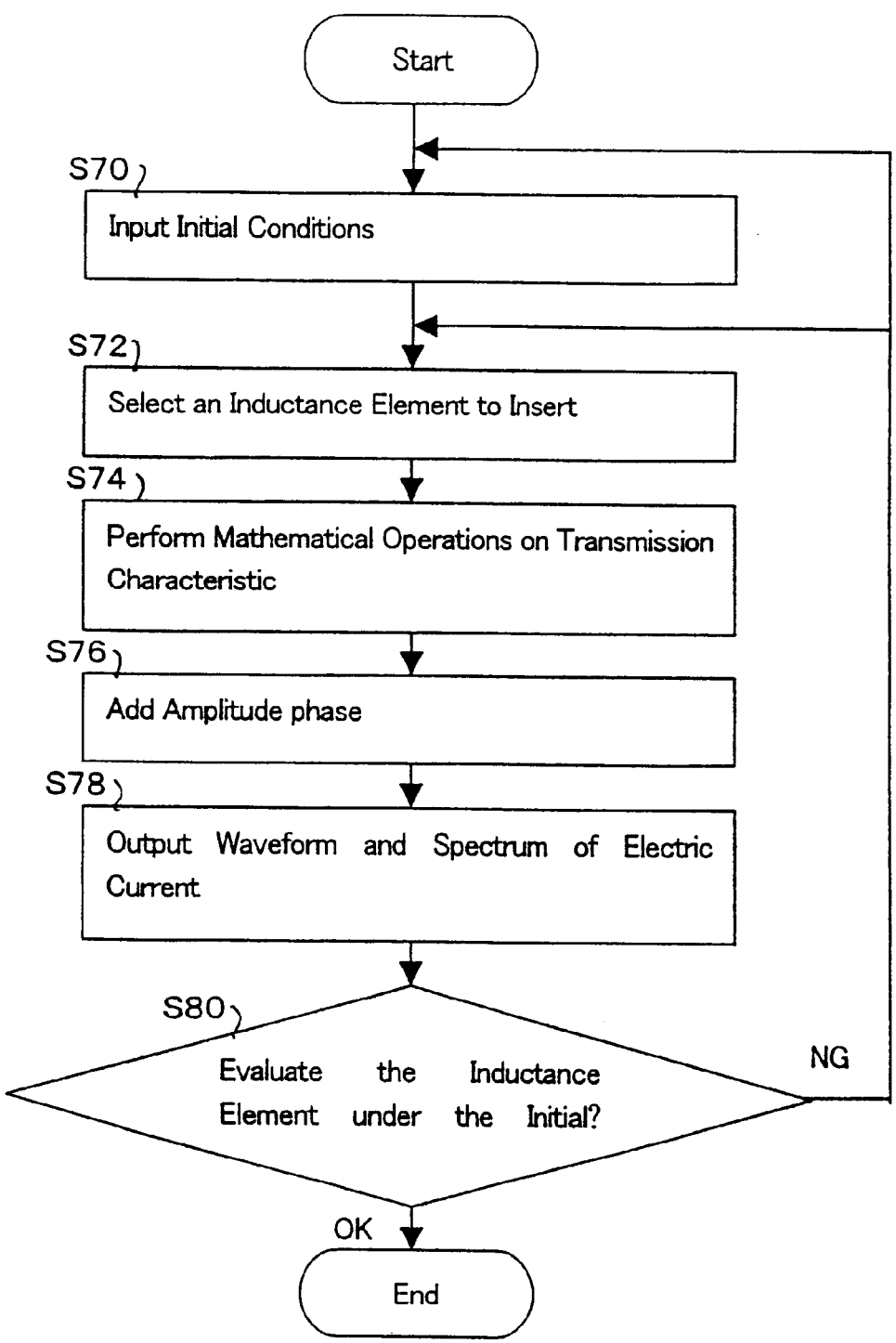
FIG. 25 is a flowchart explaining simulation process of Embodiment 9.

FIG. 24 shows the structure of a simulator of this embodiment, and FIG. 25 shows a flowchart of the simulator's operation of this embodiment. Simulator 50 has almost the same structure as said FIG. 19. In this embodiment, the simulation program stored in CD-ROM 52 performs operations shown in FIG. 24. Display unit 54 has input data/ selected element display area 54A and waveform display area 54B.

(1) Initialization . . . First, following values are set through input unit 34 (Step S70): conditions of impedance ZS and ZL at input and output side of line 14 (the values of R and X), L that is length of line 14, effective dielctric constant ∈r, impedance Z0, voltage amplitude of input pulse, frequency; and rise time. The input values are displayed on input data/selected element display area 54A of display unit 38.

(2) Selecting elements to insert . . . Next, the inductance element that is to be inserted in the signal wiring is determined through input unit 34 (Step S72). More specifically, appropriate equivalent circuit and circuit constants are determined by making use of said circuit constant analysis method of inductance element. In another way, the circuit constants corresponding to the inductance element that is to be inserted may be obtained by storing the circuit constants for each element beforehand on a table in memory 36, making use of said circuit constant analysis method of inductance element, and by referring to the table. The results are displayed on the input data/selected element display area 54A of the display unit 54.

(3) Calculating transmission characteristic . . . Next, transmission characteristic is calculated in the processing unit 32 by Expression 48, making use of the values input in the above stated way (Step S74). Then, amplitude and phase are added by Expression 49 (Step S76). In this step, the circuit constants obtained by said circuit constant analysis method of inductance element are used. Or, the values that are already stored in the memory 36 are used.

(4) Displaying signal waveform . . . Voltage-current waveform and spectrum waveform are found by substituting said calculated results in Expression 53. In other words, a signal waveform as shown in FIG. 20(C) is obtained. These waveforms are displayed on the waveform display area 54B of the display unit 54 (Step S78), and evaluated by an operator (Step S80). If the operator finds malfunctions on the waveform such as overshoot, undershoot, and the like, the operator returns to step S70 or S72 to carry out initialization and select an inductance element (NG of Step S80).

Besides operators' evaluation, automatic evaluation may be conducted by preparing beforehand evaluation standards such as overshoot, undershoot, and rise time of waveform, and the like, and comparing these evaluation standards with waveform obtained by said simulation.

The present invention is susceptible of numerous embodiments, and all are susceptible of alteration based on the above stated disclosure. For example, the following examples are included.

(1) The frequencies, measured values, values of circuit constant in said embodiments are mere examples, and those values are not fixed ones. Fine-adjustment of the circuit constants determined in said embodiments for the purpose of making them closer to the measured values may not be precluded.

(2) In said embodiments, two magnetic coupling circuits are included in an equivalent circuit: one is for resistance and the other is for inductance. However, when necessary, more magnetic coupling circuits may be mounted. For example, in the case that calculated results of inductance component are different from the measured values at several places, it is preferable to mount more magnetic coupling circuit.

(3) The present invention is suitable especially for analysis of impedance characteristic of an inductance element wherein ferrite material is used. However, this invention is also applicable to all inductance elements (coil elements).

(4) Furthermore, it is also advisable to artificially obtain an inductance element with desired impedance characteristic by connecting a circuit element having the circuit constants determined through the present invention as the equivalent element.

As stated above, because the present invention supplements the reduced value of inductance component caused by phenomenon of magnetic resonance of ferrite material, taking magnetic coupling circuit into consideration, the present invention makes it possible to accurately analyze circuit constants of an inductance element, and to accurately simulate frequency characteristic of an inductance element composed of ferrite material or performance characteristic of a circuit including thereof.

As many apparently widely different embodiments of this invention may be made without departing from the spirit and scope thereof, it is to be understood that the invention is not limited to the specific embodiments thereof except as defined in appended claims.

What is claimed is:

1. An equivalent circuit of an inductance element comprising:
   a parallel circuit whereto a first inductance, a first capacitance and a first resistance are connected in parallel;
   a second capacitance connected to said first resistance in series;
   a second inductance connected to said first resistance in parallel;
   a second resistance connected to said parallel circuit in series;
   at least one closed circuit magnetically coupled to said first inductance by mutual inductance, and having a resistance and an inductance.

2. A method of analysis of circuit constants of an equivalent circuit of an inductance element, wherein:
   the inductance element comprises a parallel circuit whereto a first inductance, a first capacitance and a first resistance are connected in parallel,
   a second capacitance is connected to said first resistance in series,
   a second inductance is connected to said first resistance in parallel;
   a second resistance connected to said parallel circuit in series;
   at least one closed circuit magnetically coupled to said first inductance by mutual inductance, and having a resistance and an inductance; and
   the method is characterized by obtaining desired impedance frequency characteristic of the inductance element by adjusting the circuit constant of said at least one closed circuit.

3. A method for analyzing circuit constants of an equivalent circuit of an inductance element, wherein:
   the inductance element comprises a parallel circuit whereto a first inductance, a first capacitance and a first resistance are connected in parallel;
   a second capacitance is connected to said first resistance in series;
   a second inductance is connected to said first resistance in parallel;
   a second resistance is connected to said parallel circuit in series;
   at least one closed circuit magnetically coupled to said first inductance by mutual inductance, and having a resistance and an inductance;
   the method comprising the steps of:
   determining circuit constants of the first inductance by measured impedance value whereat impedance of an inductance element is analogous to reactance component in the frequency domain at the resonance point or below,
   determining circuit constants of the first resistance by measuring resistance component of an inductance element at the resonance point,
   determining, in the frequency domain at the resonance point or above, circuit constants of the first capacitance by making use of measured values if the reactance component of the measured values are analogous to the reactance component of impedance of the inductance element, or making use of measured values of resistance component at the frequency, circuit constants of said first inductance, and circuit constants of said first resistance if the reactance component is not found,
   calculating changes of a reactance component for frequencies in an equivalent circuit of an inductance element, based on the circuit constants found through said steps,
   determining circuit constants and coupling coefficients of a closed circuit so that frequency changes of a reactance component of the equivalent circuit obtained through said steps are analogous to the measured frequency changes of a reactance component of an inductance element,
   redetermining circuit constants of the first resistance by making use of the circuit constants found through said steps,
   determining circuit constants of said second inductance and said second capacitance depending on the result of comparing the frequency whereat a resistance component of impedance of an inductance element agrees with a measured reactance component and the frequency whereat reactance component shows it maximum, and
   determining circuit constants of said second resistance.

4. An equivalent circuit of an inductance element as set forth in claim 1 characterized in that said mutual inductance is expressed by other circuit elements.

5. In circuit constant analysis methods for analyzing circuit constants of an equivalent circuit wherein the first inductance, the first capacitance, and the first resistance are connected in parallel, and not less than one closed circuits having resistance and inductance are magnetically coupled to said first inductance, a circuit constant analysis method of an inductance element characterized by comprising the steps of:
   determining circuit constants of the first inductance based on measured impedance value whereat impedance of the inductance element are analogous to reactance component in the frequency domain at the resonance point or below;
   determining circuit constants of the first resistance by measuring resistance component of an inductance element at the resonance point;
   determining, in the frequency domain at the resonance point or above, circuit constants of the first capacitance by making use of measured values if the measured reactance component is analogous to the reactance component of impedance of the inductance element, or making use of measured values of resistance component at the frequency, circuit constants of said first inductance, and circuit constants of said first resistance if the reactance component is not found;

calculating changes of reactance component for frequencies in an equivalent circuit of an inductance element, based on the circuit constants found through said steps;

determining circuit constants and coupling coefficients of said closed circuit so that frequency changes of reactance component of the equivalent circuit obtained through said steps are analogous to the frequency changes of measured reactance component of an inductance element.

6. An equivalent circuit of an inductance element comprising:

a parallel circuit whereto a first inductance, a first capacitance, and a first resistance connects in parallel;

a second resistance connected to either said parallel circuit or said first inductance;

at least one closed circuit magnetically coupled to said first inductance through mutual inductance, and having resistance and inductance.

7. An equivalent circuit of an inductance element as set forth in claim 6 comprising a second capacitance connecting to said first resistance in parallel.

8. An equivalent circuit of an inductance element comprising:

a parallel circuit whereto a first inductance, a first capacitance, and a first resistance connect in parallel;

a second capacitance connecting to said first resistance in series;

not less than one closed circuit magnetically coupled to said first inductance by mutual inductance, and having resistance and inductance.

9. An equivalent circuit of an inductance element as set forth in claim 8 comprising a second resistance connected in series to either said parallel circuit or said first inductance.

10. A simulator for inductance element characterized by an analyzing circuit constants of an equivalent circuit of the inductance element wherein the inductance element comprises a parallel circuit whereto a first inductance, a first capacitance and a first resistance are connected in parallel, a second capacitance connected to said first resistance in series, a second inductance connected to said first resistance in parallel, a second resistance connected to said parallel circuit in series, at least one closed circuit magnetically coupled to said first inductance by mutual inductance, and having a resistance and an inductance, wherein the desired impedance frequency characteristic of the inductance element is obtained by adjusting the circuit constant of at least one said closed circuit.

11. A record medium readable by computer and storing a program carrying out functions of determining circuit constants of an equivalent circuit of an inductance element wherein the inductance element comprises a parallel circuit whereto a first inductance, a first capacitance and a first resistance are connected in parallel, a second capacitance connected to said first resistance in series, a second inductance connected to said first resistance in parallel, a second resistance connected to said parallel circuit in series, at least one closed circuit magnetically coupled to said first inductance by mutual inductance, and having a resistance and an inductance, wherein the desired impedance characteristics of the inductance element are obtained by adjusting the circuit constant of said at least one closed circuit.

12. A simulator of a transmission line characterized by a characteristic of the transmission line wherein an inductance element is connected to a line is analyzed by making use of the circuit constants of an equivalent of an inductance element wherein the inductance element comprises a parallel circuit whereto a first inductance, a first capacitance and a first resistance are connected in parallel, a second capacitance connected to said first resistance in series, a second inductance connected to said first resistance in parallel, a second resistance connected to said parallel circuit in series, at least one closed circuit magnetically coupled to said first inductance by mutual inductance, and having a resistance and an inductance, wherein the desired impedance frequency characteristic of the inductance element is obtained by adjusting the circuit constant of said at least one closed circuit.

13. A record medium readable by computer characterized on which is stored a program including a function to obtain a waveform of a transmission line wherein an inductance element is connected to a line by making use of the circuit constants of an equivalent circuit of the inductance element, wherein the inductance element comprises a parallel circuit whereto a first inductance, a first capacitance and a first resistance are connected in parallel, a second capacitance connected to said first resistance in series, a second inductance connected to said first resistance in parallel, a second resistance connected to said parallel circuit in series, at least one closed circuit magnetically coupled to said first inductance by mutual inductance, and having a resistance and an inductance, wherein the desired impedance characteristics of the inductance element is obtained by adjusting the circuit constant of said at least one closed circuit.

* * * * *